(12) United States Patent
Wano et al.

(10) Patent No.: US 8,237,237 B2
(45) Date of Patent: Aug. 7, 2012

(54) SOLID-STATE IMAGING DEVICE, METHOD FOR MANUFACTURING SOLID-STATE IMAGING DEVICE, AND ELECTRONIC APPARATUS

(75) Inventors: Hiromi Wano, Kanagawa (JP); Takamasa Tanikuni, Kanagawa (JP); Shinichi Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 95 days.

(21) Appl. No.: 12/567,345

(22) Filed: Sep. 25, 2009

(65) Prior Publication Data

US 2010/0078745 A1   Apr. 1, 2010

(30) Foreign Application Priority Data

Sep. 29, 2008   (JP) ................................. 2008-251668
Feb. 25, 2009   (JP) ................................. 2009-042962

(51) Int. Cl.
*H01L 31/0232* (2006.01)
(52) U.S. Cl. ........ 257/432; 257/290; 257/291; 257/292; 257/293; 257/294; 257/431; 257/436; 257/437; 257/440; 257/444
(58) Field of Classification Search .......... 257/290–294, 257/431–432, 436, 437, 440, 444
See application file for complete search history.

(56) References Cited

U.S. PATENT DOCUMENTS

| | | | | |
|---|---|---|---|---|
| 6,140,570 A | * | 10/2000 | Kariya | 136/256 |
| 6,646,317 B2 | * | 11/2003 | Takeuchi | 257/436 |
| 6,710,378 B1 | * | 3/2004 | Makiuchi et al. | 257/184 |
| 7,372,121 B2 | * | 5/2008 | Zhong et al. | 257/432 |
| 7,545,016 B2 | * | 6/2009 | Holz | 257/461 |
| 7,795,058 B2 | * | 9/2010 | Uchida | 438/31 |
| 2002/0088992 A1 | * | 7/2002 | Takeuchi | 257/184 |
| 2008/0135732 A1 | * | 6/2008 | Toumiya et al. | 250/208.1 |
| 2008/0191296 A1 | * | 8/2008 | Wang et al. | 257/432 |
| 2008/0237771 A1 | * | 10/2008 | Pilla et al. | 257/458 |
| 2008/0251874 A1 | * | 10/2008 | Ishibe | 257/432 |
| 2008/0265353 A1 | * | 10/2008 | Komoguchi et al. | 257/432 |
| 2008/0303108 A1 | * | 12/2008 | Kasano et al. | 257/432 |
| 2008/0315338 A1 | * | 12/2008 | Yeo | 257/431 |
| 2009/0034904 A1 | * | 2/2009 | Tsuzuki et al. | 385/14 |
| 2009/0127577 A1 | * | 5/2009 | Hodono | 257/98 |
| 2009/0127645 A1 | * | 5/2009 | Knights et al. | 257/432 |
| 2009/0243013 A1 | * | 10/2009 | Nakaji et al. | 257/432 |
| 2010/0119192 A1 | * | 5/2010 | Fujikata et al. | 385/14 |

FOREIGN PATENT DOCUMENTS

| | | |
|---|---|---|
| JP | 2000-150845 | 5/2000 |
| JP | 2003-324189 | 11/2003 |
| JP | 2004-221532 | 8/2004 |
| JP | 2005-294749 | 10/2005 |
| JP | 2006-086320 | 3/2006 |

* cited by examiner

*Primary Examiner* — Alan R Wilson
*Assistant Examiner* — Mohammed Shamsuzzaman
(74) *Attorney, Agent, or Firm* — SNR Denton US LLP

(57) ABSTRACT

A solid-state imaging device includes a light-receiving portion, which serves as a pixel, and a waveguide, which is disposed at a location in accordance with the light-receiving portion and which includes a clad layer and a core layer embedded having a refractive index distribution in the waveguiding direction.

16 Claims, 29 Drawing Sheets

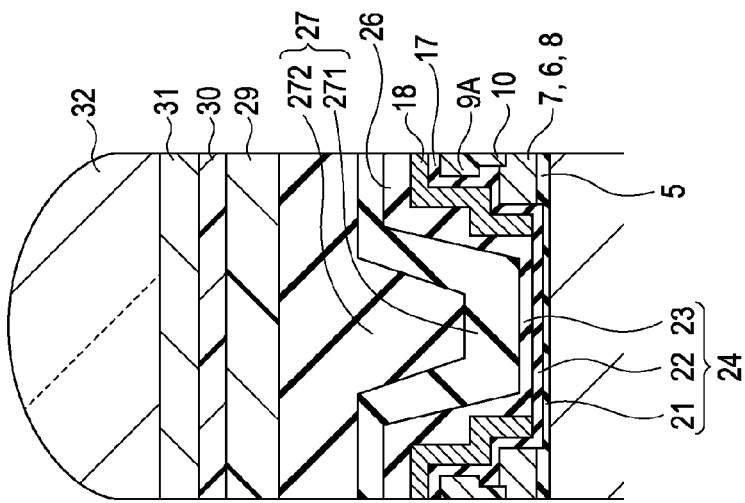
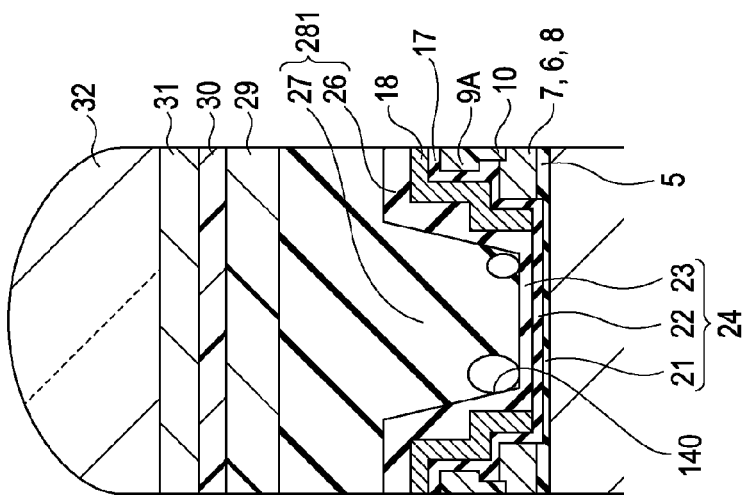
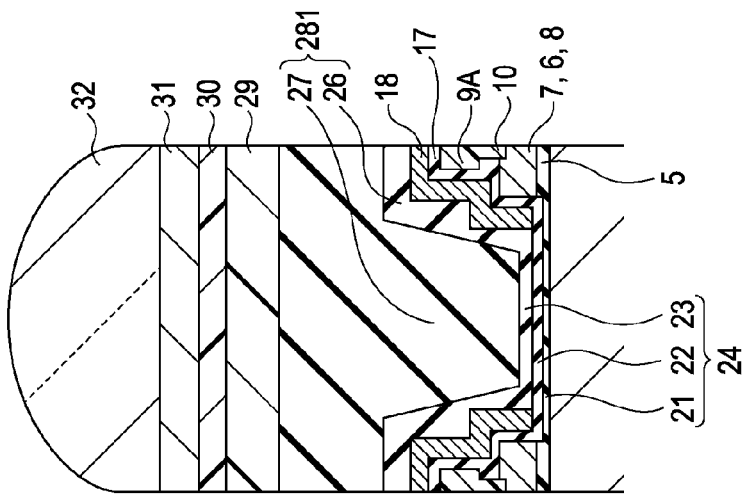

SAMPLE E

SAMPLE G

WAVEGUIDE SHAPE 1:
FILM THICKNESS OF SILICON OXIDE FILM 23 0 nm

WAVEGUIDE SHAPE 2:
FILM THICKNESS OF SILICON OXIDE FILM 23 50 nm

WAVEGUIDE SHAPE 3:
FILM THICKNESS OF SILICON OXIDE FILM 23 100 nm

WAVEGUIDE SHAPE 4:
FILM THICKNESS OF SILICON OXIDE FILM 23 150 nm

SAMPLE D

SAMPLE F

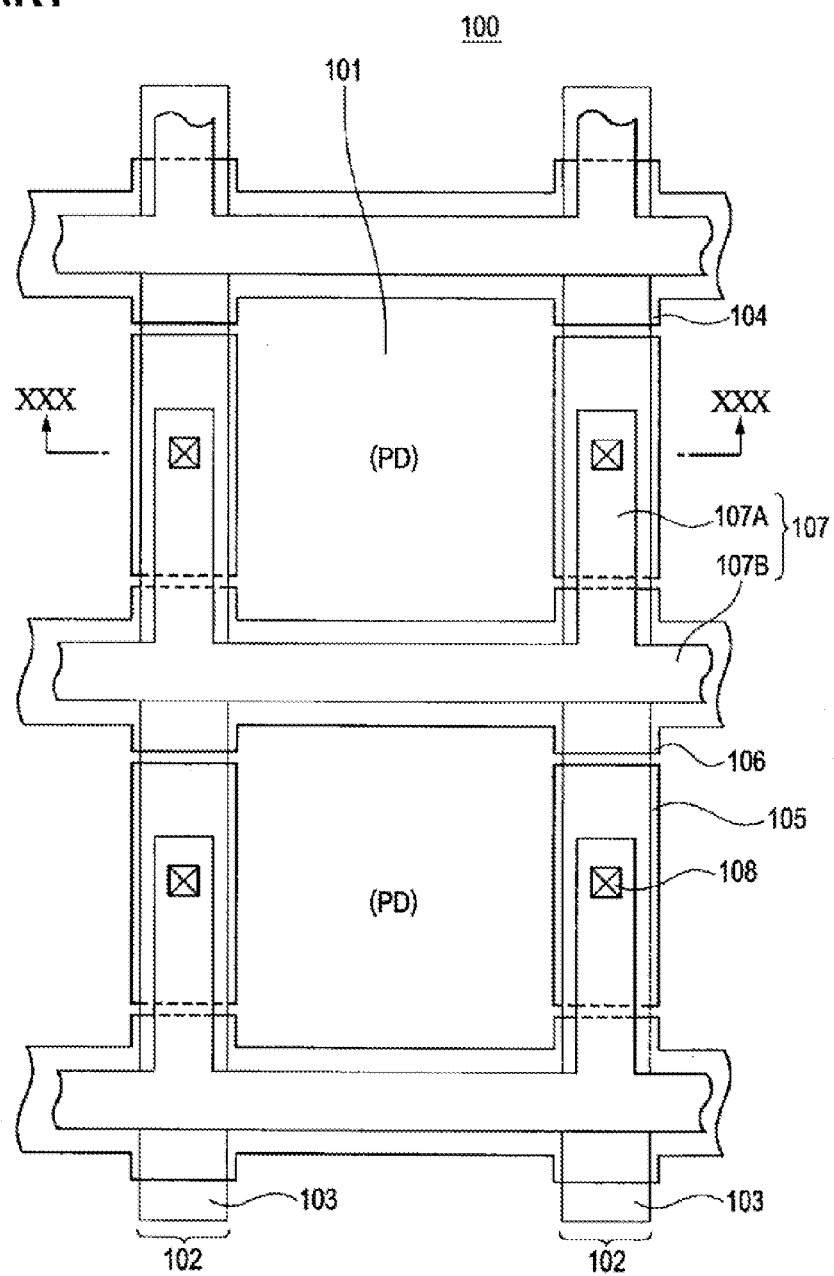
PRIOR ART   FIG. 29

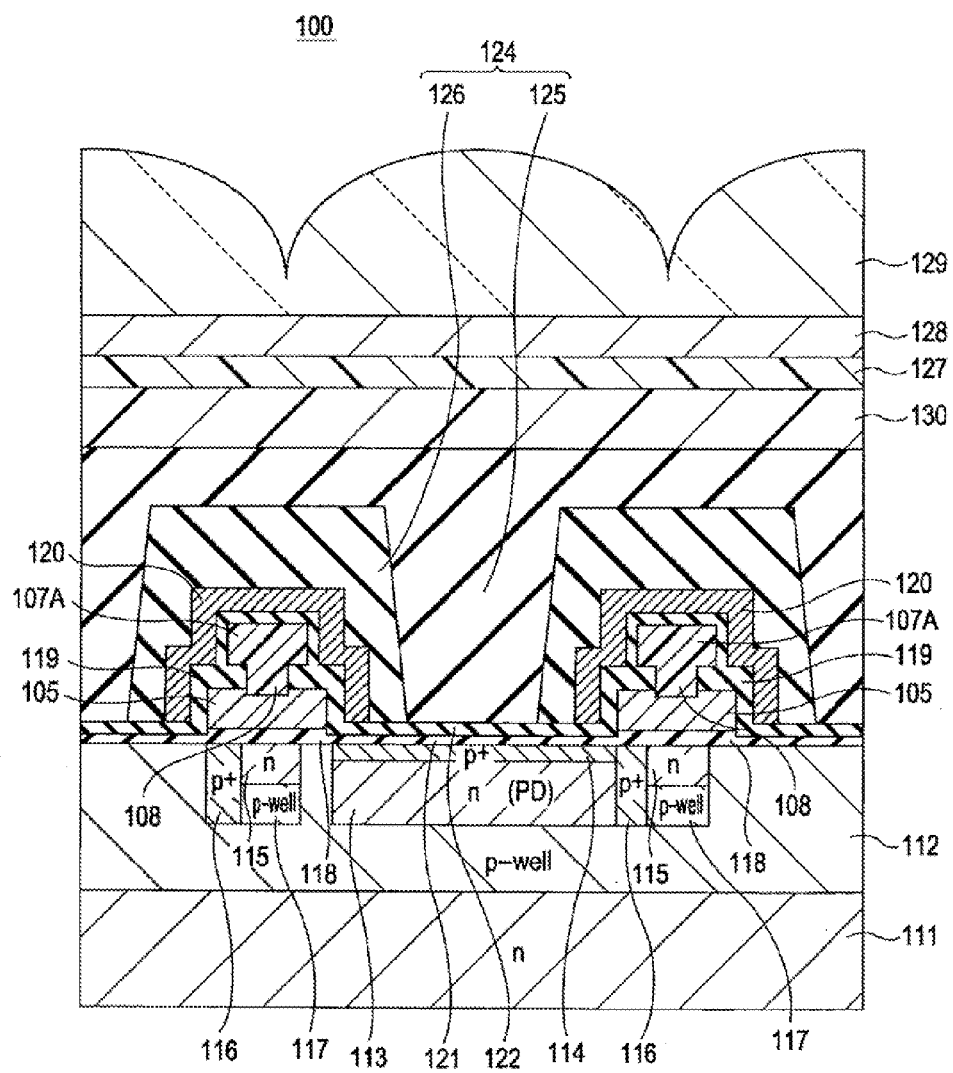
PRIOR ART  FIG. 30

PRIOR ART    FIG. 31
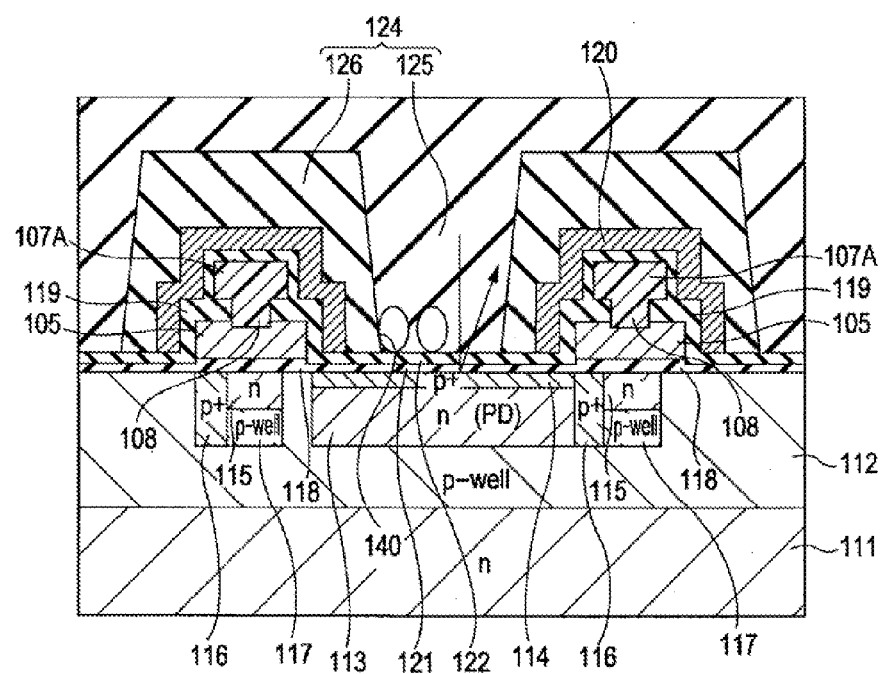

SOLID-STATE IMAGING DEVICE, METHOD FOR MANUFACTURING SOLID-STATE IMAGING DEVICE, AND ELECTRONIC APPARATUS

CROSS REFERENCES TO RELATED APPLICATIONS

This application is based upon and claims the benefit of priority to Japanese Patent Application Nos. JP2008-251668, filed in the Japanese Patent Office on Sep. 29, 2008, and JP2009-042962, filed in the Japanese Patent Office on Feb. 25, 2009, the entirety both of which are hereby incorporated by reference to the extent permitted by law.

BACKGROUND OF THE INVENTION

1. Field of the Invention

The present invention relates to a solid-state imaging device, a method for manufacturing the solid-state imaging device, and an electronic apparatus including the solid-state imaging device.

2. Description of the Related Art

Solid-state imaging devices are roughly classified into charge transfer type solid-state imaging devices typified by a CCD image sensor and amplification type solid-state imaging devices typified by a CMOS image sensor. In this regard, "CCD" is the abbreviated name for a charge coupled device, and "CMOS" is the abbreviated name for a complementary metal oxide semiconductor.

A CCD solid-state imaging device includes an imaging region including a plurality of light-receiving portions arranged two-dimensionally, that is, photodiodes serving as photoelectric conversion elements, and vertical transfer resister portions which are arranged in accordance with the individual photodiode lines and which have a CCD structure. The CCD solid-state imaging device is configured to further include a horizontal transfer resister portion having a CCD structure in which a signal charge from the imaging region is transferred in the horizontal direction, an output portion, a peripheral circuit constituting a signal processing circuit, and the like.

A CMOS solid-state imaging device is configured to include a pixel portion (imaging region), in which a plurality of pixels including photodiodes serving as photoelectric conversion elements constituting light receiving portions and a plurality of pixel transistors are arranged two-dimensionally, and a peripheral circuit portion, e.g., signal processing, disposed around the pixel portions. The pixel transistor is formed from a MOS transistor.

Regarding these solid-state imaging devices, in order to increase the light-condensation efficiency of incident light along with the pixel being made finer, the configurations, in which waveguides including clad layers and core layers having different refractive indices are provided in accordance with the individual photodiodes, have been proposed. Solid-state imaging devices provided with a waveguide function are disclosed in, for example, Japanese Unexamined Patent Application Publication No. 2000-150845, Japanese Unexamined Patent Application Publication No. 2003-324189, Japanese Unexamined Patent Application Publication No. 2004-221532, Japanese Unexamined Patent Application Publication No. 2005-294749, and Japanese Unexamined Patent Application Publication No. 2006-86320.

FIG. 29 and FIG. 30 show an example of a CCD solid-state imaging device in the related art. FIG. 29 is a plan view of a key portion of an imaging region. FIG. 30 is a sectional view of the section taken along a line XXX-XXX shown in FIG. 29. As shown in FIG. 29, in a CCD solid-state imaging device 100, usually, photodiodes (PDs) serving as square light-receiving portions 101 are arranged two-dimensionally and vertical transfer resister portions 102 having a CCD structure to transfer signal charges in the vertical direction are disposed in accordance with the individual light-receiving portion lines. The vertical transfer resister portion 102 is configured to include a buried transfer channel region 103 and a plurality of transfer electrodes 104, 105, and 106 disposed thereon with an gate insulating film therebetween. In the present example, a plurality of transfer electrodes 104, 105, and 106, which are formed from a polysilicon film serving as a first layer, are disposed in such a way that a photodiode (PD) serving as one light-receiving portion 101 is associated with three transfer electrodes.

The transfer electrodes 104 and 106 are disposed continuously in the horizontal direction while being passed between light-receiving portions 101, which are adjacent to each other in the vertical direction, in such a way that electrodes of individual vertical transfer resister portions 102 are connected to each other, where the electrodes correspond to each other. On the other hand, the individual transfer electrodes 105 doubling as reading electrodes are disposed independently in the shape of an island and, therefore, are connected to a connection wiring 107 formed from a polysilicon film serving as a second layer. This connection wiring 107 is configured to include a band-shaped portion 107B disposed on the transfer electrodes 104 and 106 extending between the light-receiving portions 101, which are adjacent to each other in the vertical direction, with an insulating film therebetween and an extension portion 107A which is integrated with the band-shaped portion 107B and which is extended on each of the individual transfer electrodes 105. This extension portion 107A is connected to a contact portion 108 of each of the transfer electrodes 105 in the individual vertical transfer resister portions 102.

In the cross-sectional structure shown in FIG. 30, a second electrical conduction type, for example, a p-type first semiconductor well region 112 is disposed on an n-type, which is a first electrical conduction type, semiconductor substrate 111. A photodiode (PD) serving as a light-receiving portion 101 is disposed in this p-type first semiconductor well region 112. The photodiode (PD) is disposed including an n-type semiconductor region 113 and a p-type semiconductor region 114 to suppress a dark current. In the p-type first semiconductor well region 112, an n-type buried transfer channel region 115 and a p$^+$ channel stop region 116 are further formed and a p-type second semiconductor well region 117 is disposed immediately under the buried transfer channel region 115.

The transfer electrodes 104 to 106 formed from the first layer polysilicon are disposed on the buried transfer channel region 115 with a gate insulating film 118 therebetween, and the connection wiring 107 which is formed from the second layer polysilicon and which is connected to the island-shaped transfer electrode 105 is disposed with an insulating film 119 therebetween. The gate insulating film 118 is formed from, for example, a silicon oxide film, and the insulating film 119 is formed from, for example, a silicon nitride film. A light-shielding film 120 is disposed in such a way as to cover the transfer electrodes 104 to 106 and the connection wiring 107 except the photodiode (PD) with the insulating film 119 therebetween. The light-shielding film 120 is not disposed on the photodiode (PD). On the surface of the photodiode (PD), an insulating film 121 formed from, for example, a silicon oxide film and, for example, a silicon nitride film serving as an antireflection film 122 extended from the silicon nitride film, which serves as the insulating film 119 on the above-described transfer electrodes 104 to 106 side, are disposed.

Waveguides 124 to condense incident light effectively on the photodiode (PD) are disposed above the individual photodiodes (PD). The waveguide 124 includes a core layer 125 formed from, for example, a silicon nitride film having a high refractive index and a clad layer 126 formed from, for example, a silicon oxide film surrounding the core layer 125 and having a low refractive index. The waveguide 124 shown in FIG. 30 is configured in such a way that the bottom of the core layer 125 comes into contact with the silicon nitride film serving as the antireflection film 122.

Furthermore, a passivation film 130 is disposed, an on-chip color filter 128 is disposed thereon with a planarizing film 127 therebetween, and an on-chip microlens 129 is disposed thereon.

The respective widths of the extension portion 107A and the band-shaped portion 107B of the connection wiring 107 may be smaller than the width of the transfer electrode 105 and the widths of the transfer electrodes 104 and 106 between pixels adjacent to each other in the vertical direction. Alternatively, although not shown in the drawing, the respective widths of the extension portion 107A and the band-shaped portion 107B of the connection wiring 107 may be the same as the width of the transfer electrode 105 and the widths of the transfer electrodes 104 and 106 between pixels adjacent to each other in the vertical direction.

The waveguide 124 is formed as described below. After the light-shielding film 120 is formed, a silicon oxide film serving as the clad layer is formed all over the surface in such a way as to fill the inside of an opening portion surrounded by the light-shielding film 120 above the photodiode (PD). Subsequently, selective etching of the silicon oxide film is conducted by using a resist mask so as to form a trench portion at a location in accordance with the photodiode (PD). At the same time, the silicon oxide film remaining as the side wall of the trench portion constitutes the clad layer 126. Thereafter, the core layer 125 formed from, for example, a silicon nitride film is embedded into the trench portion surrounded by the clad layer 126, so that the waveguide 124 including the clad layer 126 and the core layer 125 is formed.

SUMMARY OF THE INVENTION

Regarding a solid-state imaging device, in particular a CCD solid-state imaging device, it has become difficult to maintain the sensitivity, the smear characteristic, and other optical characteristics along with cell size reduction of the pixel. As for the measure to improve this, a type of waveguide structure has been proposed, which performs a function of entering the light into the Si interface by providing the interface of different refractive indices in the vicinity of the Si interface of the photodiode (PD) and concentrating the light energy on the high-refractive index side, as described above.

Regarding the waveguide structure, as the refractive index of the core layer of a high-refractive index part, on which the light energy is concentrated, becomes higher, a higher light-condensation efficiency is obtained and the sensitivity and the smear characteristic become better.

In order to embed uniformly a high-refractive index material serving as the core layer into a deep trench portion with a large aspect ratio disposed in the clad layer 126, it is desired to use a high density plasma film formation method which can ensure high embeddability. Hereafter the high density plasma film formation method is referred to as the HDP film formation method. Regarding the HDP film formation method, gases, e.g., silane based gases, $N_2$, $O_2$, TEOS, and ammonia, are used and a core layer can be formed from a SiON film or a SiN film.

In this regard, the HDP film formation method can ensure high embeddability by adjusting, that is, controlling, the ratio (D/S ratio) of deposition (D) to sputtering (S). On the other hand, there is a tradeoff relationship between the refractive index n of a film embedded and the embeddability determined on the basis of the D/N ratio. As the sputtering rate increases to enhance the embeddability, the refractive index of the buried film decreases. Conversely, as the deposition rate increases to increase the refractive index, the embeddability becomes poor. That is, regarding a film having a high refractive index, the embeddability tends to become poor, and regarding a film having a low refractive index, the embeddability tends to become good.

In the HDP film formation method, as the refractive index of the core layer increases to obtain the sensitivity characteristic, the embeddability becomes poor and voids 140, or cavities, occur on the bottom of the core layer (refer to FIG. 31). That is, an increase in refractive index of the core layer causes an occurrence of a void 140. If voids 140 occur, the incident light is reflected diffusely at the parts of the voids 140 and, as a result, deterioration of sensitivity characteristic and image variations occur.

On the other hand, in the CCD solid-state imaging device, the antireflection film 122 formed from a silicon nitride film is disposed on the surface of the photodiode (PD) serving as a light-receiving portion, that is, on the Si surface, with the silicon oxide film 121 therebetween in order to ensure the sensitivity characteristic. In general, as described above, the silicon nitride film serving as the insulating film 119 between the transfer electrode and the connection wiring and between the transfer electrode and the light-shielding film is diverted in such a way as to have an antireflection function.

In the case where the waveguide 124 is applied to such a configuration, a trench portion is formed in the clad layer 126 while the antireflection film (SiN film) serves as a stopper, and the high-refractive index core layer 125 is embedded so as to come into contact with the antireflection film 122, an antireflection effect is not obtained easily. the reason for this is that the difference in refractive index between the antireflection film 122 and the high-refractive index core layer 125 is small and, thereby, the antireflection effect, which has been exhibited in the state of no waveguide, is not exhibited easily. That is, as shown in FIG. 27, reflection L12 of the light guided with the waveguide 124 occurs at the interface between the Si surface of the photodiode (PD) and the silicon oxide film 121 thereon and, thereby, the sensitivity characteristic is not obtained.

It is conceived that a film 141, e.g., a silicon oxide film, having a low refractive index is disposed on the antireflection film 122 formed from a silicon nitride film, as shown in FIG. 28, in order to prevent interfacial reflection on the Si surface. In FIG. 28, a film 141 is disposed in such a way that the silicon oxide film of the clad layer 126 is left on the antireflection film 122. Regarding this configuration, interfacial reflection on the Si surface can be suppressed. However, interfacial reflection L11 at the interface between the silicon oxide film 141 and the high-refractive index core layer 125 increases. Therefore, the sensitivity characteristic is impaired.

Problems in deterioration of the sensitivity characteristic and an occurrence of image variation related to the above-described waveguide structure may occur with respect to not only the CCD solid-state imaging device, but also the CMOS solid-state imaging device having the waveguide structure.

The present invention addresses the above-identified, and other problems associated with existing methods and apparatuses. It is desirable to provide a solid-state imaging device, in which the sensitivity characteristic is improved and an occurrence of image variation is suppressed, and a method for manufacturing the solid-state imaging device.

Furthermore, it is desirable to provide an electronic apparatus including a camera or the like provided with the above-described solid-state imaging device.

A solid-state imaging device according to an embodiment of the present invention includes a light-receiving portion serving as a pixel and a waveguide which is disposed at a location in accordance with the light-receiving portion and which includes a clad layer and a core layer embedded having a refractive index distribution in the wave-guiding direction.

The solid-state imaging device according to an embodiment of the present invention includes the core layer which is embedded having a refractive index distribution in the wave-guiding direction and which serves as the core layer constituting the waveguide. That is, embedding is not easy on the bottom side and, therefore, a low-refractive index film exhibiting high embeddability is embedded, while a high-refractive index film is embedded in an upper portion. Consequently, voids do not occur easily on the bottom side of the core layer, and an occurrence of diffuse reflection resulting from the voids is suppressed. Furthermore, since the refractive index on the bottom side of the core layer is low, interfacial reflection between the waveguide and the substrate layer is suppressed.

A method for manufacturing a solid-state imaging device, according to an embodiment of the present invention, includes the steps of forming a clad layer on a light-receiving portion serving as a pixel and embedding a core layer, which has a refractive index distribution in a wave-guiding direction, into a trench portion surrounded by the clad layer, wherein the clad layer and the core layer constitute the waveguide.

The method for manufacturing a solid-state imaging device, according to an embodiment of the present invention, includes the step of embedding the core layer, which has a refractive index distribution in a wave-guiding direction, into the trench portion surrounded by the clad layer. That is, embedding is not easy on the bottom side and, therefore, a low-refractive index film exhibiting high embeddability is embedded, while a high-refractive index film is embedded in an upper portion. Consequently, the core layer can be formed without an occurrence of void on the bottom side. Furthermore, since the refractive index on the bottom side of the core layer is low, the waveguide, in which interfacial reflection between the waveguide and the substrate layer is suppressed, can be formed.

A solid-state imaging device according to an embodiment of the present invention includes a light-receiving portion serving as a pixel and a waveguide tube which is disposed at a location in accordance with the light-receiving portion and which includes a reflection film and a buried layer embedded in a trench portion surrounded by the reflection film while having a refractive index distribution in the wave-guiding direction.

The solid-state imaging device according to an embodiment of the present invention includes the buried layer embedded having a refractive index distribution in the wave-guiding direction while the buried layer constitutes the waveguide tube. That is, embedding is not easy on the bottom side and, therefore, a low-refractive index film exhibiting high embeddability is embedded, while a high-refractive index film is embedded in an upper portion. Consequently, voids do not occur easily on the bottom side of the buried layer, and an occurrence of diffuse reflection resulting from the voids is suppressed. Furthermore, since the refractive index on the bottom side of the buried layer is low, interfacial reflection between the waveguide tube and the substrate layer is suppressed.

An electronic apparatus according to an embodiment of the present invention includes a solid-state imaging device, an optical system to guide incident light to the solid-state imaging device, and a signal processing circuit to process an output signal from the solid-state imaging device, wherein the solid-state imaging device includes a light-receiving portion serving as a pixel and a waveguide which is disposed at a location in accordance with the light-receiving portion and which includes a clad layer and a core layer embedded having a refractive index distribution in the wave-guiding direction.

The electronic apparatus according to an embodiment of the present invention includes the above-described solid-state imaging device. Consequently, an occurrence of diffuse reflection resulting from the voids in the core layer of the waveguide is suppressed. Furthermore, interfacial reflection between the waveguide and the substrate layer is suppressed.

The diffuse reflection and the interfacial reflection can be suppressed by the solid-state imaging device according to an embodiment of the present invention. Therefore, the sensitivity is improved and an occurrence of image variation can be suppressed.

A solid-state imaging device, in which the sensitivity is improved and an occurrence of image variation can be suppressed, can be produced by the method for manufacturing a solid-state imaging device according to an embodiment of the present invention.

A high-image quality, high quality electronic apparatus can be provided by the electronic apparatus according to an embodiment of the present invention because the sensitivity is improved and an occurrence of image variation can be suppressed with respect to the solid-state imaging device.

BRIEF DESCRIPTION OF THE DRAWINGS

FIGS. 9A to 9C are sectional views of the samples related to the graphs shown in FIG. 7 and FIG. 8;

FIG. 29 is a plan view of a key portion of a solid-state imaging device according to an example in the related art;

FIG. 30 is a sectional view of the section taken along a line XXX-XXX shown in FIG. 29; and FIG. 31 is a sectional view for explaining problems of an example in the related art.

DESCRIPTION OF THE PREFERRED EMBODIMENTS

The preferred embodiments (hereafter referred to as embodiments) for executing the present invention will be described below. The explanation will be conducted in the following order.

1. First embodiment (configuration example of solid-state imaging device and example of manufacturing method)
2. Second embodiment (configuration example of solid-state imaging device)
3. Third embodiment (configuration example of solid-state imaging device)
4. Fourth embodiment (configuration example of solid-state imaging device and example of manufacturing method)
5. Fifth embodiment (configuration example of solid-state imaging device and example of manufacturing method)
6. Sixth embodiment (configuration example of solid-state imaging device)
7. Seventh embodiment (configuration example of solid-state imaging device)
8. Eighth embodiment (configuration example of electronic apparatus)

1. First Embodiment

Configuration Example of Solid-State Imaging Device

Figure 1:
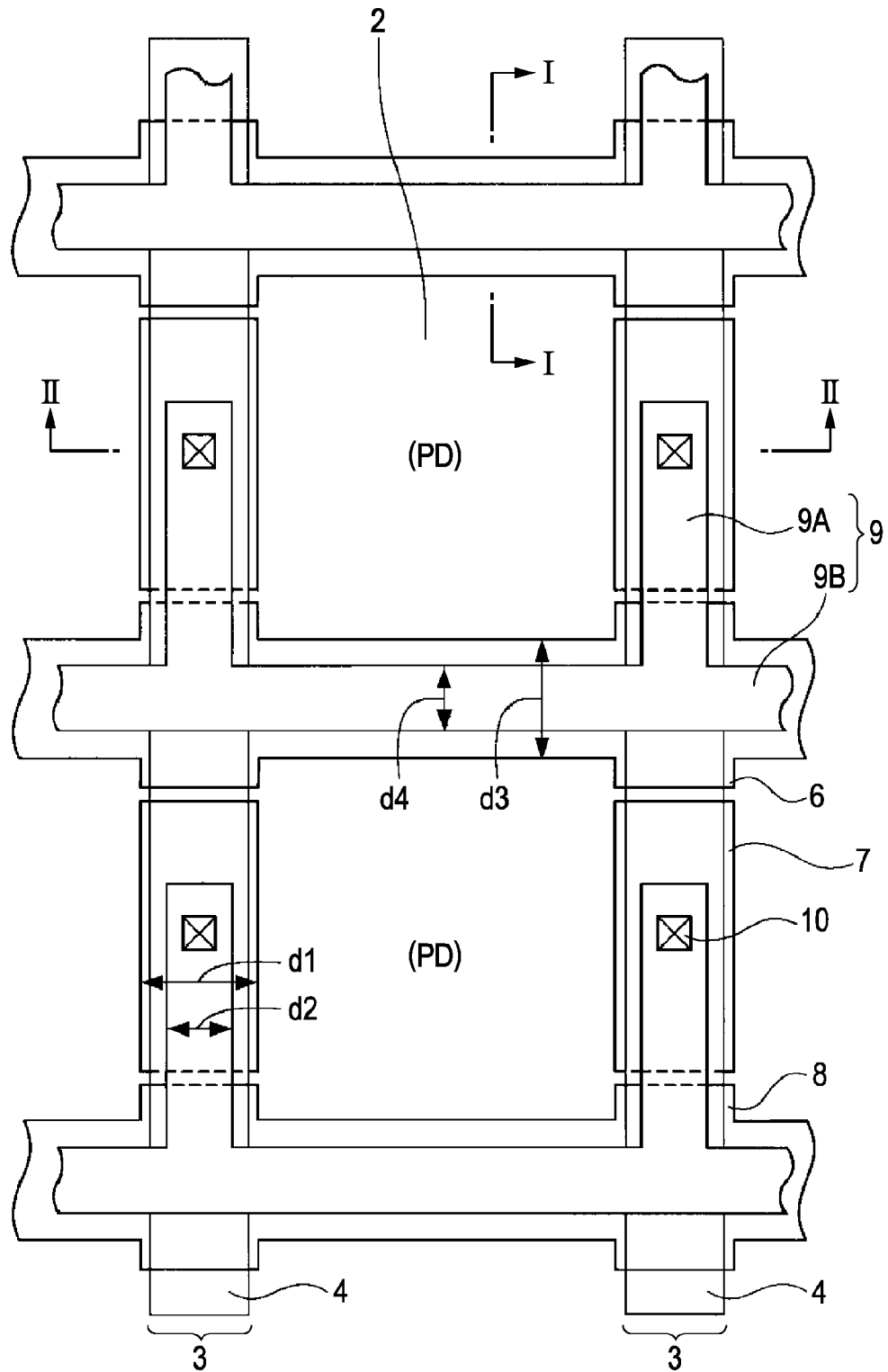
FIG. 1 is a schematic plan view of a solid-state imaging device according to a first embodiment of the present invention.
Figure 2:
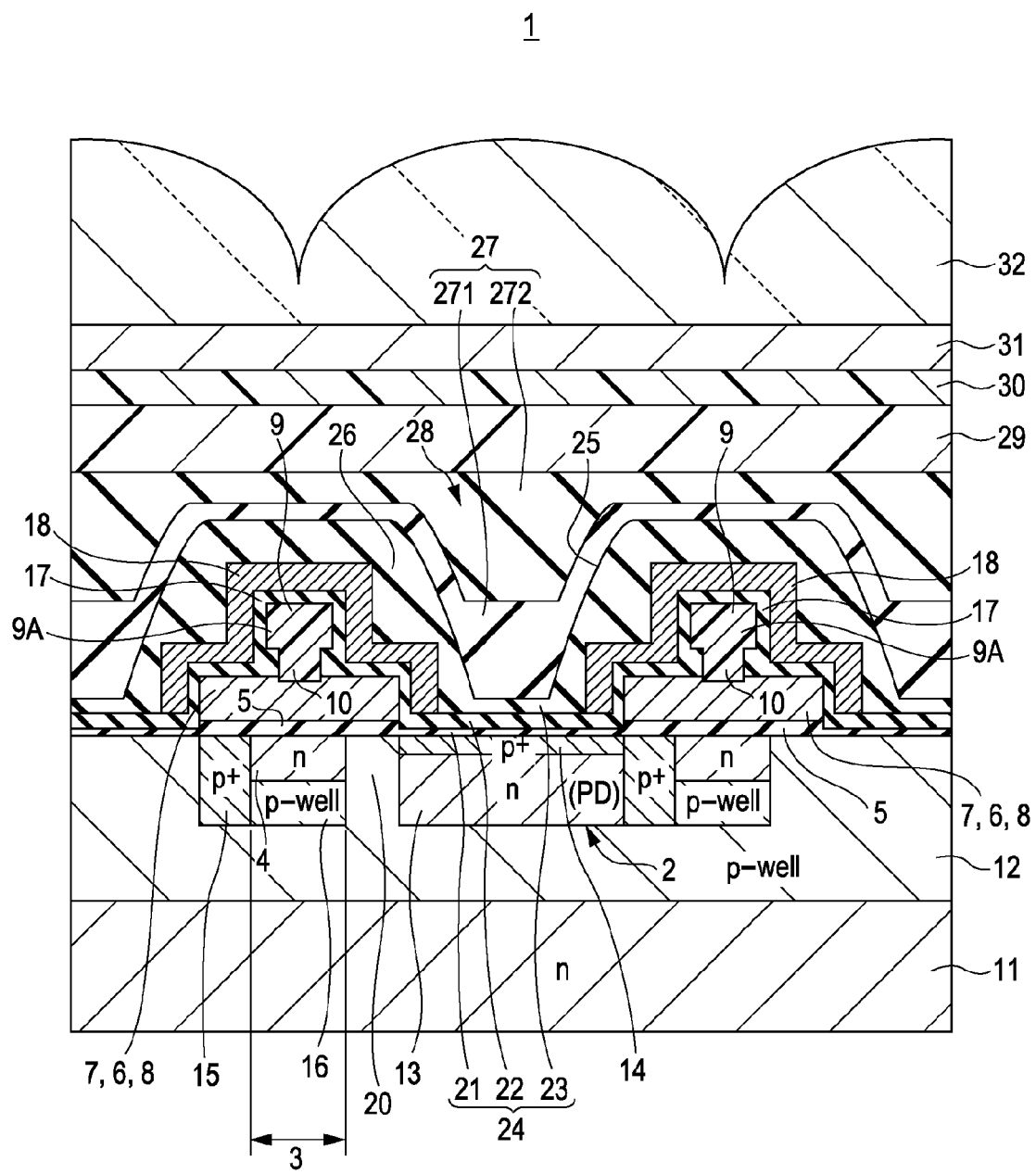
FIG. 2 is a sectional view of a section taken along a line II-II shown in FIG. 1.

FIG. 1 and FIG. 2 show a first embodiment in which a solid-state imaging device according to an embodiment of the present invention is applied to a CCD solid-state imaging device. FIG. 1 is a plan view of a key portion of an imaging region of the CCD solid-state imaging device according to a first embodiment of the present invention. FIG. 2 is a sectional view of a section taken along a line II-II shown in FIG. 1.

As shown in FIG. 1, a solid-state imaging device 1 according to the first embodiment has an imaging region including light-receiving portions 2, which are in the shape of, for example, a square or a rectangle, while a square is employed in the present example, and which are arranged two-dimensionally, and vertical transfer resister portions 3, which have a CCD structure and which are disposed in accordance with the individual lines of the light-receiving portions 2. The light-receiving portion 2 is formed from a photodiode (PD). Although not shown in the drawing, the solid-state imaging device 1 includes a horizontal transfer register portion which has the CCD structure and which is connected to a vertical transfer resister portion 3 so as to transfer a charge in the horizontal direction and an output portion connected to a final stage of the horizontal transfer register portion. The vertical transfer resister portion 3 is configured to transfer signal charges read from the light-receiving portions 2 in the vertical direction sequentially. The vertical transfer resister portion 3 is configured to include a buried channel region (hereafter referred to as a transfer channel region) 4 and a plurality of transfer electrodes 6, 7, and 8 arranged thereon in the transfer direction with a gate insulating film therebetween. The transfer electrodes 6, 7, and 8 are formed from a polysilicon film serving as a first layer. In the present example, three transfer electrodes 6, 7, and 8 are disposed in such a way as to become associated with one light-receiving portion 2.

Among the transfer electrodes, the transfer electrodes 6 and 8 are disposed continuously in the horizontal direction while being passed between the light-receiving portions 2, which are adjacent to each other in the vertical direction, in such a way that electrodes of individual vertical transfer resister portions 3 are connected to each other, where the electrodes correspond to each other. On the other hand, the individual transfer electrodes 7, which are sandwiched between the two transfer electrodes 6 and 8 and which double as reading electrodes, are disposed independently in the shape of an island in the individual vertical transfer resister portions 3 and, therefore, are connected to a connection wiring 9 formed from a polysilicon film serving as a second layer. The connection wiring 9 is configured to include a band-shaped portion 9B disposed on the transfer electrodes 6 and 8 extending in the shape of a band between the light-receiving portions 2, which are adjacent to each other in the vertical direction, with an insulating film therebetween and an extension portion 9A which is integrated with the band-shaped portion 9B and which is extended on each of the island-shaped transfer electrodes 7. The extension portion 9A of the connection wiring 9 is connected to each of contact portions 10 of the transfer electrodes 7 in the individual vertical transfer resister portions 3.

In the cross-sectional structure, as shown in FIG. 2, a second electrical conduction type, for example, a p-type first semiconductor well region 12 is disposed on an n-type, which is a first electrical conduction type, silicon semiconductor substrate 11. A photodiode (PD) constituting a light-receiving portion 2 is disposed in this p-type first semiconductor well region 12. The photodiode (PD) is disposed including an n-type semiconductor region 13 serving as a charge accumulation region and a p$^+$ semiconductor region 14 to suppress a dark current of the surface. In the p-type first semiconductor well region 12, an n-type transfer channel region 4 and a p$^+$ channel stop region 15 are further disposed and a p-type second semiconductor well region 16 is disposed immediately under the n-type transfer channel region 4.

The transfer electrodes 6 to 8 formed from the first layer polysilicon are disposed on the n-type transfer channel region 4 with a gate insulating film 5 therebetween, and the connection wiring 9, which is formed from the second layer polysilicon, is further disposed with an insulating film 17 therebetween. The extension portion 9A of the connection wiring 9 is connected to the contact portion 10 of the island-shaped transfer electrode 7 through a contact hole in the insulating layer 17. The individual transfer electrodes 6 to 8 are disposed over the p$^+$ channel stop region 15, the transfer channel region 4, and a region from the transfer channel region 4 to an end portion of the light-receiving portion 2. That is, the transfer electrode 7 is extended to a reading region 20 between the transfer channel region 4 and the light-receiving portion 2. A light-shielding film 18 is disposed in such a way as to cover the transfer electrodes 6 to 8 and the connection wiring 9 around the light-receiving portion 2 except the light-receiving portion 2 with the insulating film 17 therebetween.

The gate insulating film 5 is formed from, for example, a silicon oxide (SiO$_2$) film. The insulating film 17 between the first layer polysilicon and the second layer polysilicon, between the light-shielding film 18 and the transfer electrodes 6 to 8, and between the light-shielding film 18 and the connection wiring 9 is formed from, for example, a silicon nitride (SiN) film. On the surface of the light-receiving portion 2, a laminated insulating film 24 including a silicon oxide (SiO$_2$) film 21, a silicon nitride (SiN) film serving as an antireflection film 22, and an insulating film, for example, a silicon oxide film 23, having a refractive index of about 1.4 to 1.6 is disposed. The silicon nitride film serving as the antireflection film 22 is formed at the same time with the silicon nitride film serving as the insulating film 17 under the above-described light-shielding film 18. The silicon oxide film 23 may be formed as a part of a clad layer 26 of a waveguide 28 described below. That is, the silicon oxide film 23 is disposed between the antireflection film 22 and a core layer 27 of the waveguide.

The waveguides 28, according to an embodiment of the present invention, which will be described later and which are to condense incident light effectively on the light-receiving portions 2, are disposed above the individual light-receiving portions 2. The waveguide 28 includes basically a clad layer formed from a low-refractive index material and a core layer formed from a high-refractive index material. Furthermore, a passivation film 29 formed from, for example, a silicon nitride film is disposed, and an on-chip color filter 31 is disposed thereon with a planarizing film 30 formed from, for example, an organic coating material, e.g., an acrylic resin, therebetween. An on-chip microlens 32 is disposed thereon.

The waveguide 28 is formed from the clad layer having a low refractive index and a trench portion 25 which is surrounded by the clad layer 26 and in which the core layer 27 having a high refractive index is embedded. The clad layer 26 is formed from, for example, a silicon oxide film having a refractive index n of 1.4 and is formed in such a way that a part of the clad layer 26 covers the antireflection film 22.

Furthermore, in the present embodiment, in particular, the waveguide 28 is formed in such a way that the core layer 27 has a refractive index distribution in the wave-guiding direction. The core layer 27 is embedded into the trench portion 25 of the clad layer 26 by using a high density plasma film formation method (HDP film formation method). In the embedding of the core layer 27 by using the HDP film formation method, the embedding is conducted while the D/S ratio is adjusted, that is, controlled. That is, regarding the embedding on the bottom side of the trench portion 25, the embedding is conducted while the D/S is specified to be small in such a way that the good embeddability is ensured and voids (or "cavities") do not occur. Subsequently, the embedding is conducted while the D/S ratio is increased. As a result, in the core layer 27, a first film 271 having a relatively low refractive index is formed with almost no void on the bottom side, and a dense second film 272 having a relatively high refractive index is formed thereon.

Figure 3:
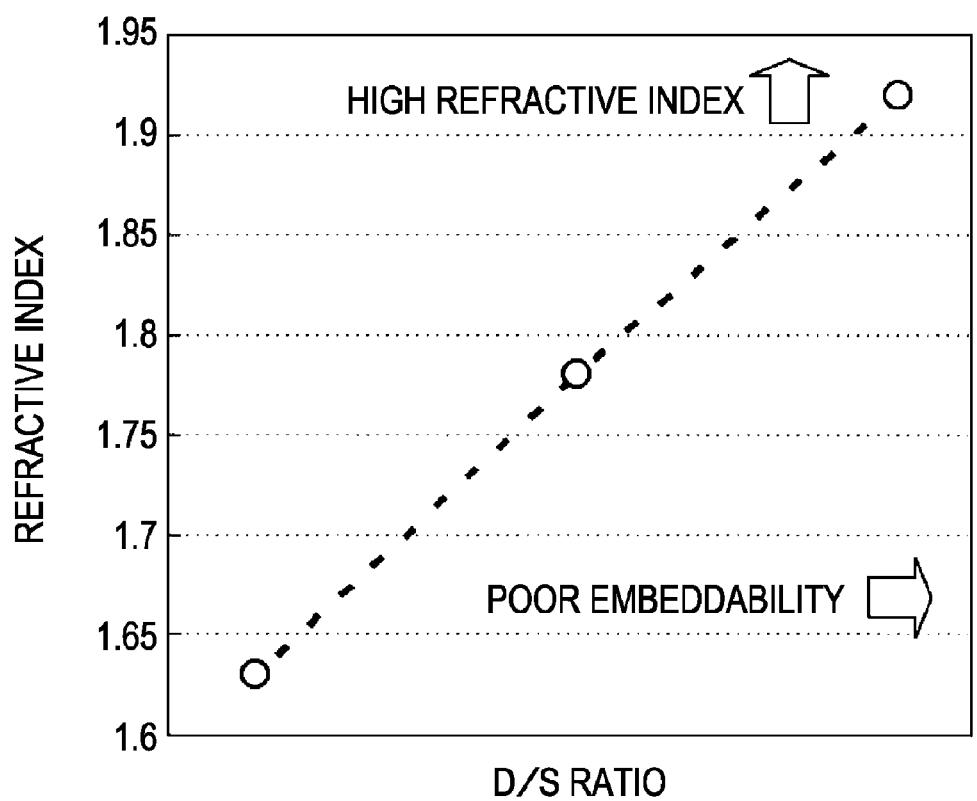
FIG. 3 is a characteristic diagram showing the relationship between the D/S ratio and the refractive index in a HDP film formation method, for explaining an embodiment of the present invention.

FIG. 3 shows the relationship between the D/S ratio and the refractive index n in the HDP film formation method. The horizontal axis indicates the D/S ratio, and the vertical axis indicates the refractive index n of a formed film. The refractive index n increases as the D/S ratio increases. Since a deposition component is enhanced, the embeddability becomes poor. The refractive index n decreases as the D/S ratio decreases. Since a sputtering component is enhanced, the embeddability becomes good.

In the present embodiment, the core layer 27 is embedded through the use of the characteristic shown in FIG. 3 of the HDP film formation method. Therefore, the core layer exhibiting good embeddability as a whole core layer is formed including the first film 271 having a low refractive index on the bottom side and the second film 272 having a high refractive index in the upper portion. The core layer 27 may has a two-layer structure in which the first layer 271 and the second layer 272 have uniform refractive indices in their respective films. The first film 271 may be formed from a plurality of layers, that is, a plurality of stages of (for example, multistage) layers in such a way that an upper layer portion has a higher refractive index. Alternatively, the refractive index may be changed continuously.

Regarding the structure formed as described above, embedding is conducted in such a way that the refractive index is maximized while the embeddability is ensured with respect to a core width at each height. Therefore, the effective refractive index of the entire core 27 is increased and a high sensitivity characteristic is exhibited by the resulting structure.

Incidentally, the above-described two-layer structure in which the first layer and the second layer have uniform refractive indices in their respective films can also be applied to solid-state imaging devices according to a second embodiment and other embodiments described later. Furthermore, the above-described configuration in which the first film is formed from a plurality of films having different refractive indices and the configuration in which the first film is formed from the film having the changed refractive index can also be applied to solid-state imaging devices according to the second embodiment and other embodiments described later.

In the case where the core 27 has the two-layer structure composed of the first film 271 and the second film 272, the refractive index of the first film 271 may be specified to be about 1.6 to 1.7, and the refractive index of the second film 272 may be specified to be about 1.8 to 2.0. Alternatively, in the case where the first film 271 is the film having a refractive index changed in a plurality of stages or continuously, the refractive index of the first film 271 may be specified to be about 1.45 to 1.74, and the refractive index of the second film 272 may be specified to be about 1.75 to 2.00.

In the present embodiment, the gases used in the HDP film formation method are specified to be gases selected from the group including silane based gases, $N_2$, $O_2$, TEOS, ammonia, argon, trimethylsilane, tetramethylsilane, and the like. Subsequently, in the present embodiment, film formation is conducted while the ratio and the flow rate of the selected gases are controlled and, thereby, the first film 271 and the second film 272 are formed from a SiON film, a SiN film, or a SiC film. Alternatively, the first 271 may be formed from SiON film, and second film 272 may be formed from a SiN film or a SiC film.

In an example of the waveguide 28, the clad layer 26 may be formed from a silicon oxide ($SiO_2$) film having a refractive index of 1.45. The first film 271 of the core layer 27 may be formed from a silicon oxynitride (SiON) film having a refractive index of 1.7, and the second film 272 may be formed from a silicon nitride (SiN) film having a refractive index of 1.8.

In the HDP film formation method, the relationship between the D/S ratio and the refractive index n shown in FIG. 3 holds in the case where, for example, a $SiO_2$ film or other films besides the SiC film, the SiN film, and the like are formed. In the case where the SiN film is formed, gases of silane, $O_2$, $N_2$, and TEOS are used. In the case where the SiC film is formed, in addition to silane, $O_2$, and $N_2$, gases, e.g., trimethylsilane and tetramethylsilane, in which methyl groups are contained instead of hydrogen groups of silane, are used.

It is desirable that the thickness dO of the first film 271 of the core layer 27 is specified in such a way as to satisfy the following formula.

$$0 \leq (\text{refractive index n of first film 271}) \times (\text{thickness dO of first film 271}) \leq 720 \text{ nm}$$

The reason for this will be described later. In this regard, the upper limit is not necessarily 720 nm, but may be a value nearly equal to the longest wavelength λ used in the solid-state imaging device.

Example (1) of Method for Manufacturing Solid-State Imaging Device

FIG. 4A to FIG. 5B show a method for manufacturing a solid-state imaging device according to the first embodiment, in particular a method for manufacturing a waveguide. The individual production step diagrams show the section corresponding to the section taken along a line II-II shown in FIG. 1.

Figure 4A:
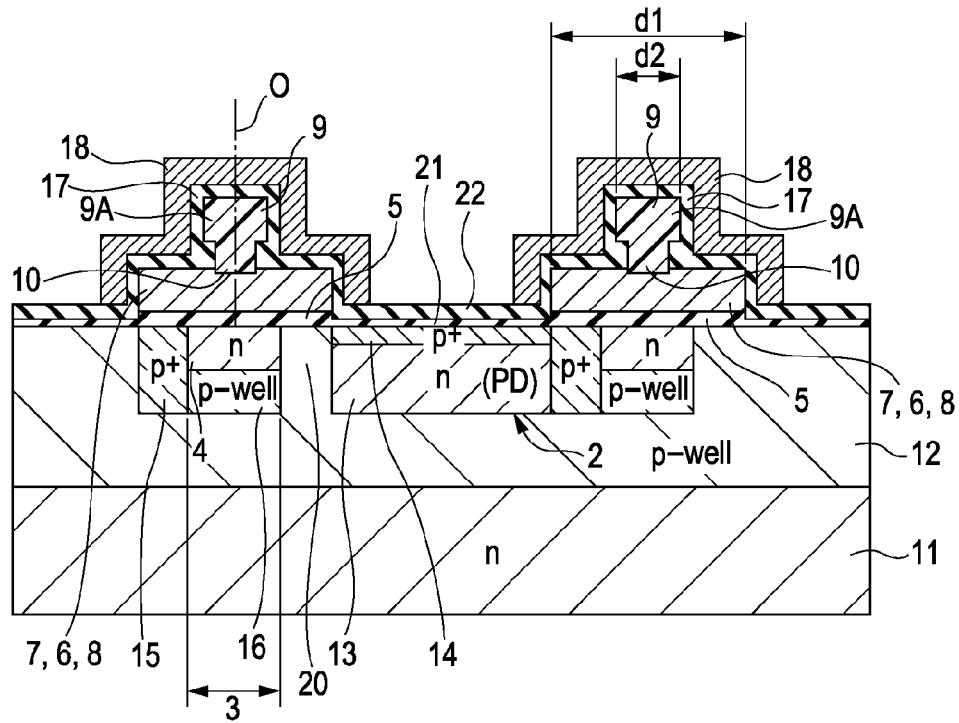
FIGS. 4A and 4B are production step diagrams showing an example of a method for manufacturing a solid-state imaging device according to the first embodiment.

Initially, as shown in FIG. 4A, transfer electrodes 6, 7, and 8 are formed repeatedly from a polysilicon film serving as a first layer on the semiconductor substrate 11 with a gate insulating film 5 formed from, for example, a silicon oxide ($SiO_2$) film therebetween. Although all elements are not shown in the drawing, a photodiode (PD) serving as a light-receiving portion 2, a transfer channel region 4, a $p^+$ channel stop region 15, and the like have already been formed on the semiconductor substrate 11. Furthermore, a connection wiring 9 (9A, 9B), in which an extension portion 9A is connected to a transfer electrode 7 with an insulating film 17 formed from, for example, a silicon nitride (SiN) film therebetween, is formed from a polysilicon film serving as a second film.

In a vertical transfer resister portion 3, the transfer electrodes 6 to 8 having a width of d1 are formed from the polysilicon film serving as the first layer, and the extension portion 9A of the connection wiring 9 is formed having a width of d2 smaller than the width d1 (d1>d2) from the polysilicon film serving as the second layer. Furthermore, although not shown in the drawing, the transfer electrodes 6 and 8 having a width of d3 are formed between the light-receiving portions 2, which are adjacent to each other in the vertical direction, from the polysilicon film serving as the first layer, and a band-shaped portion 9B of the connection wiring 9 is formed having a width of d4 smaller than the width d3 (d3>d4) from the polysilicon film serving as the second layer (refer to FIG. 1). Moreover, an light-shielding film 18 is formed from, for example, an Al film with the insulating film 17 formed from, for example, a silicon nitride (SiN) film therebetween. The vertical transfer resister portion 3 is formed from the transfer channel region 4, the gate insulating film 5, and the transfer electrodes 6 to 8. A silicon oxide film 21 and an antireflection film 22 extended from the insulating film 17 formed from the silicon nitride film are formed on the surface of the light-receiving portion 2.

In this regard, the laminated structure of the transfer electrodes 6 to 8, the extension portion 9A of the connection wiring 9, and the light-shielding film 18 in the vertical transfer resister portion 3 is formed to become symmetric with respect to the axis center O in the cross-section in the horizontal direction (cross-section indicated by a line II-II shown in FIG. 1). Likewise, although not shown in the drawing, the laminated structure of the transfer electrodes 6 and 8 between the light-receiving portions 2 in the vertical direction, the band-shaped portion 9B of the connection wiring 9, and the light-shielding film 18 is formed to become symmetric with respect to the axis center O in the cross-section in the vertical direction (cross-section indicated by a line I-I shown in FIG. 1).

Figure 4B:
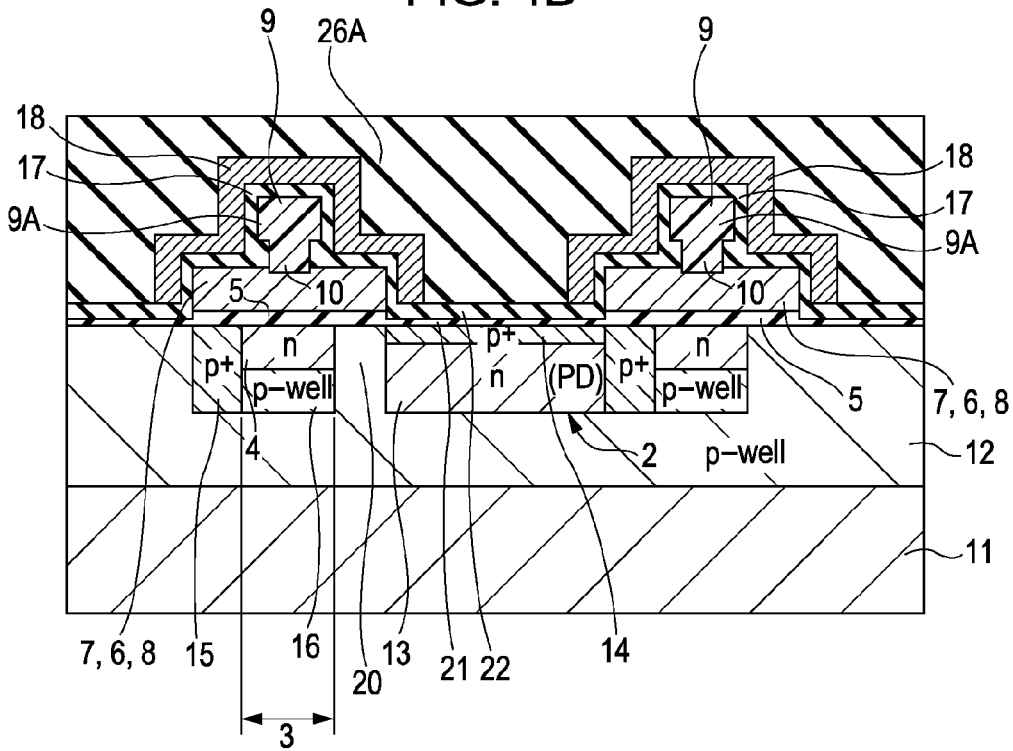

Next, as shown in FIG. 4B, a clad material film 26A serving as a clad layer of the waveguide is formed all over the surface including the light-shielding film 18 and an opening portion in accordance with the photodiode (PD). As for this clad material film 26A, silicon oxide ($SiO_2$), e.g., boron-phosphorus-silicate glass (BPSG), is used. The clad material film 26A is formed by, for example, a chemical vapor deposition (CVD) method. Thereafter, the surface is flattened by using, for example, a chemical mechanical polishing (CMP) method or a dry-etching method.

Figure 5A:
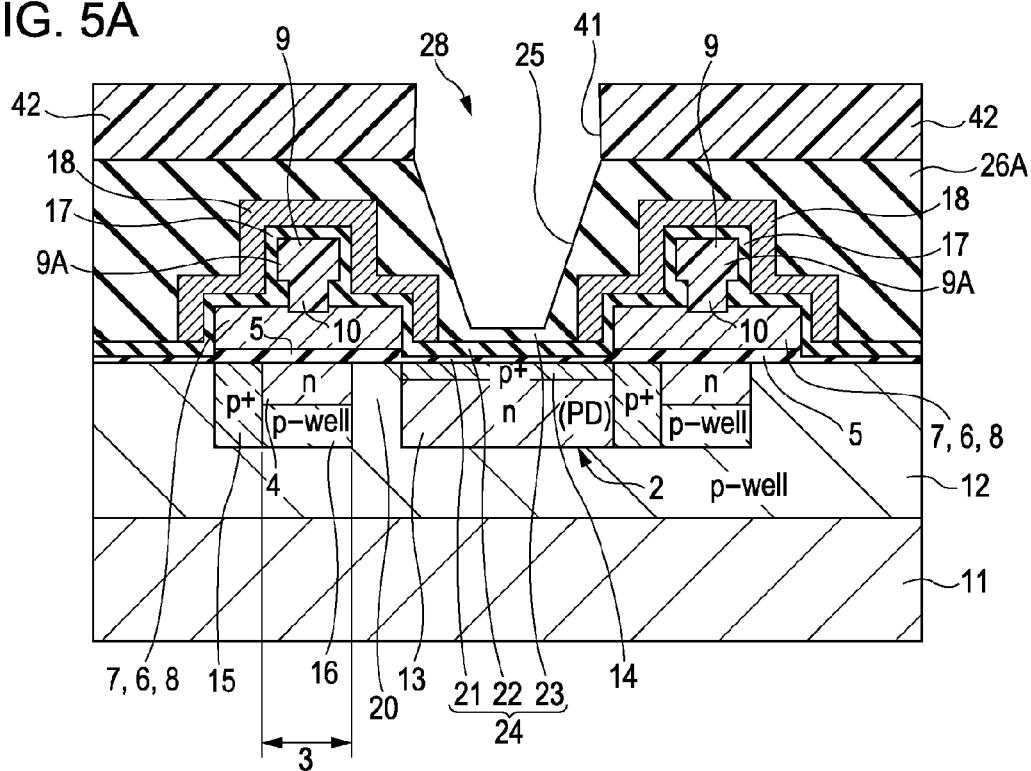
FIGS. 5A and 5B are production step diagrams showing an example of a method for manufacturing a solid-state imaging device according to the first embodiment.

Subsequently, as shown in FIG. 5A, a resist mask 42 having an opening portion 41 in a portion in accordance with the photodiode (PD) is formed on the clad material film 26A by using lithography. The clad material film 26A is dry-etched through the resulting resist mask 42 so as to form a trench portion 25. Consequently, a clad layer 26 is formed on the inner wall of the trench portion 25 from the clad material film 26A. In this dry etching, etching is conducted in such a way that the bottom of the trench portion 25 does not reach the antireflection film 22 and the clad material film having a desired film thickness remains. In this manner, a silicon oxide film 23 is formed on the antireflection film 22 from the clad material film.

Figure 5B:
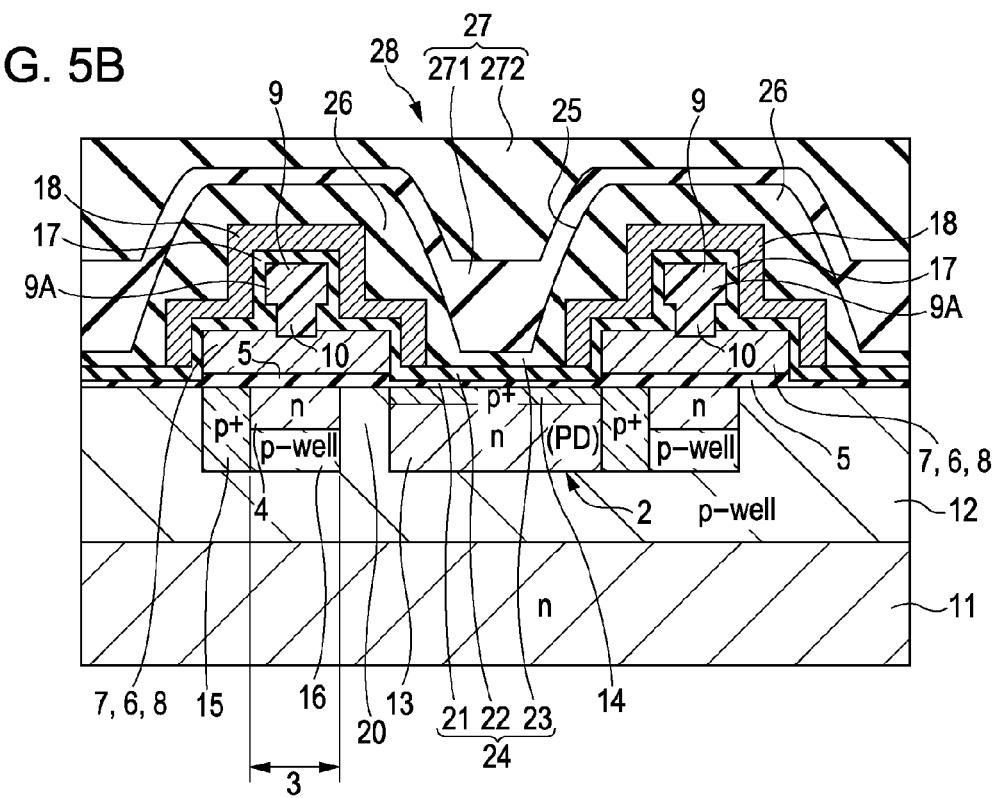

Then, as shown in FIG. 5B, gases selected from the group including silane based gases, $N_2$, $O_2$, TEOS, ammonia, argon, trimethylsilane, tetramethylsilane, and the like are used, and a core layer 27 is formed by the HDP film formation method while the ratio and the flow rate of the selected gases are controlled. In the first film formation, the ratio and the flow rate of the selected gases are controlled in such a way as to reduce the D/S ratio and, thereby, a first film 271 including no void, exhibiting good embeddability, and having a relatively low refractive index is formed on the bottom side of the trench portion 25. Subsequently, the ratio and the flow rate of the selected gases are controlled in such a way as to increase the D/S ratio and, thereby, a second film 272 having a relatively high refractive index is formed on the upper portion side of the trench portion 25, that is, on the first film 271. The film formation of the second film 272 is conducted at a high D/S ratio. However, the first film 271 has already been formed and the aspect ratio of the remaining trench portion is smaller than the initial aspect ratio. Therefore, embedding can be conducted under a good embeddability condition.

The core layer 27 exhibiting good embeddability and having a refractive index distribution in the wave-guiding direction is formed by the first film 271 and the second film 272.

Since the gases to be used are selected from the above-described gases, the first film 271 and the second film 272 can be formed by selectively embedding a SiON film, a SiN film, or a SiC film.

As an example, gases of silane, $N_2$, and $O_2$ are used, the first film 271 is formed from a SiON film (refractive index: 1.7) while the flow rate ratio of these gases is controlled and, subsequently, the second film 272 is formed thereon from SiN (refractive index: 1.8), so that the core layer 27 is formed.

After the core layer 27 is formed, a passivation film, a planarizing film, an on-chip color filter, and an on-chip microlens are formed as usual, so that a desired solid-state imaging device 1 is obtained.

Example (2) of Method for Manufacturing Solid-State Imaging Device

Figure 6A:
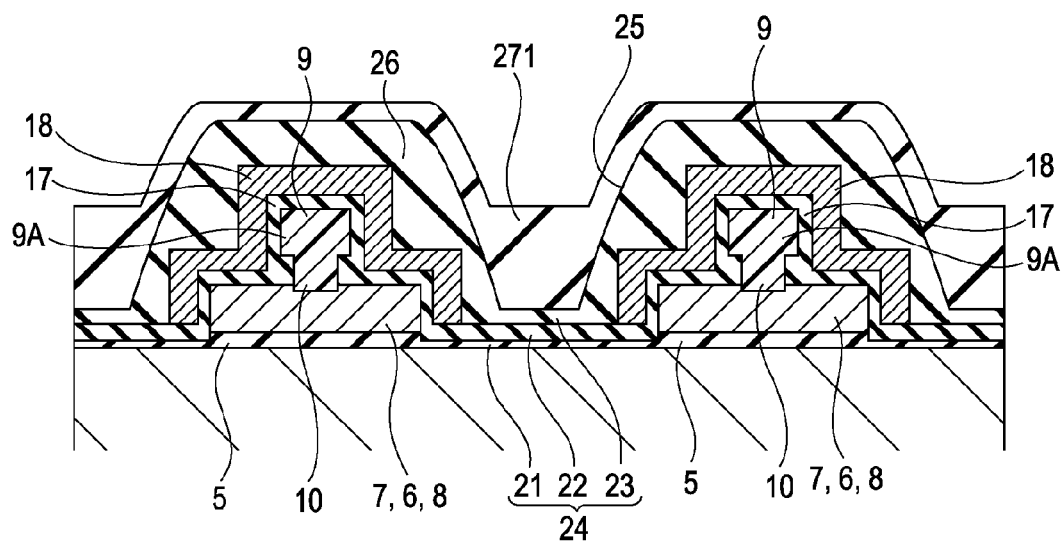
FIGS. 6A and 6B are production step diagrams showing another example of a method for manufacturing a solid-state imaging device according to the first embodiment.
Figure 6B:
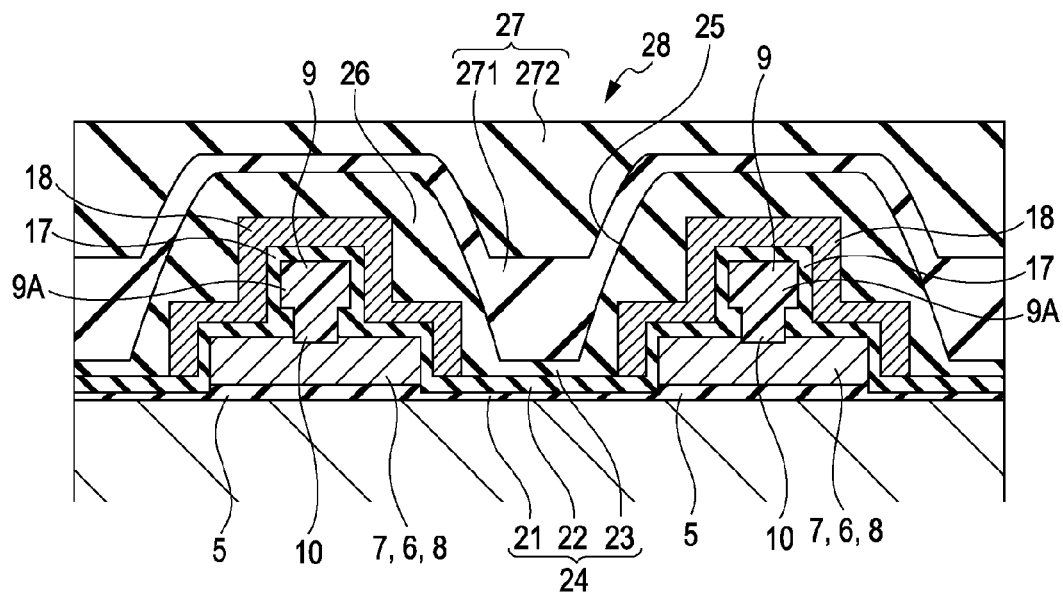

FIGS. 6A and 6B show another example of the method for manufacturing a solid-state imaging device according to the first embodiment. The present example is a manufacturing method in which clad layer 26 is formed in a different manner. In the present embodiment, after the above-described state shown in FIG. 4A, the clad layer 26 is formed following the surface of the laminated structure around the concave portion in accordance with the light-receiving portion 2, as shown in FIG. 6A.

The clad material serving as the clad layer 26 can be formed from, for example, a NSG film, a BPSG film, or a PSG film by a thermal chemical vapor deposition (CVD) method or a plasma silicon oxide ($SiO_2$) film by a plasma CVD method. In this regard, NSG is the abbreviated name for nitride silicate glass, BPSG is the abbreviated name for boron-phosphorus-silicate glass, and PSG is the abbreviated name for phospho-silicate glass. For example, the BPSG film can be formed following the surface of the laminated structure by forming a film having a small film thickness of 50 to 300 nm and conducting a heat treatment.

Next, if necessary, the shape of the resulting clad 26 is adjusted in such a way that height differences on the side wall surfaces (inclined surface, vertical surface) are reduced and a necessary film thickness remains on the antireflection film 22. This shape control may be conducted by dry etching, reflow through a heat treatment, or the like.

Thereafter, a first film 271 and a second film 272 are formed in a manner similar to that described in Example (1) of the manufacturing method so as to form a core 27. Subsequently, a passivation film 29, a planarizing film 30, an on-chip color filter 31, and an on-chip microlens 32 are formed as usual, so that a desired solid-state imaging device 1 is obtained.

Example (3) of Method for Manufacturing Solid-State Imaging Device

In the present embodiment, in formation of a first film 271 of a core layer 27, a film including a plurality of layers are formed in such a way that the refractive index increases from the lower layer toward the upper layer, while the flow rate ratio of the gases used is controlled.

Alternatively, in formation of a first film 271 of a core layer 27, the film is formed in such a way that the refractive index increases continuously from the lower layer toward the upper layer, while the flow rates of the gases used are controlled.

In each case, a clad layer 26 is formed by the method described in Example (1) or (2) of the manufacturing method.

In the above-described individual manufacturing methods, the first film 271 can be formed from a film including a plurality of layers (for example, multistage) in such a way that the refractive index increases from the lower layer toward the upper layer, while the flow rate ratio of the gases used is controlled or a film in which the refractive index is changed continuously. In the case where the refractive index is changed in multistage or continuously, the light does not recognize the interface and, thereby, it is possible to reduce interfacial reflection and improve the sensitivity characteristic.

According to the solid-state imaging device 1 in the above-described first embodiment, the core layer 27 is formed in the trench portion 25 of the clad layer 26 while exhibiting good embeddability, so that a favorable waveguide 28 can be formed. Therefore, the sensitivity characteristic can be improved and an occurrence of image variation can be suppressed. Furthermore, according to the methods for manufacturing a solid-state imaging device in the above-described individual examples, the solid-state imaging device 1, in which the sensitivity characteristic is improved and an occurrence of image variation is suppressed, can be produced.

That is, the core layer 27 is formed in the trench portion 25 having a large aspect ratio by using an HDP film formation method. At that time, on the bottom side, film formation is conducted while the ratio and the flow rate of the gases used are controlled in such a way as to reduce the D/S ratio. Therefore, the first film 271 having no void and exhibiting good embeddability is formed. This first film 271 is a film having a relatively low refractive index. Subsequently, on the upper side of the first film 271, film formation is conducted while the ratio and the flow rate of the gases used are controlled in such a way as to increase the D/S ratio and, thereby, the high-refractive index second film 272 having dense film quality is formed. At this time, the D/S ratio is high, but the trench portion 25 is shallow because the first film 271 has already been embedded on the bottom side of the trench portion 25. Therefore, the second film 272 can be formed under a good embeddability condition. Consequently, there is almost no void (or cavity) in the core layer 27, so that diffuse reflection of the incident light resulting from voids does not occur, the function as a waveguide 28 is performed sufficiently, and the sensitivity can be improved by an increase in light condensation efficiency. Furthermore, an occurrence of image variation resulting from voids can be suppressed.

Figure 7:
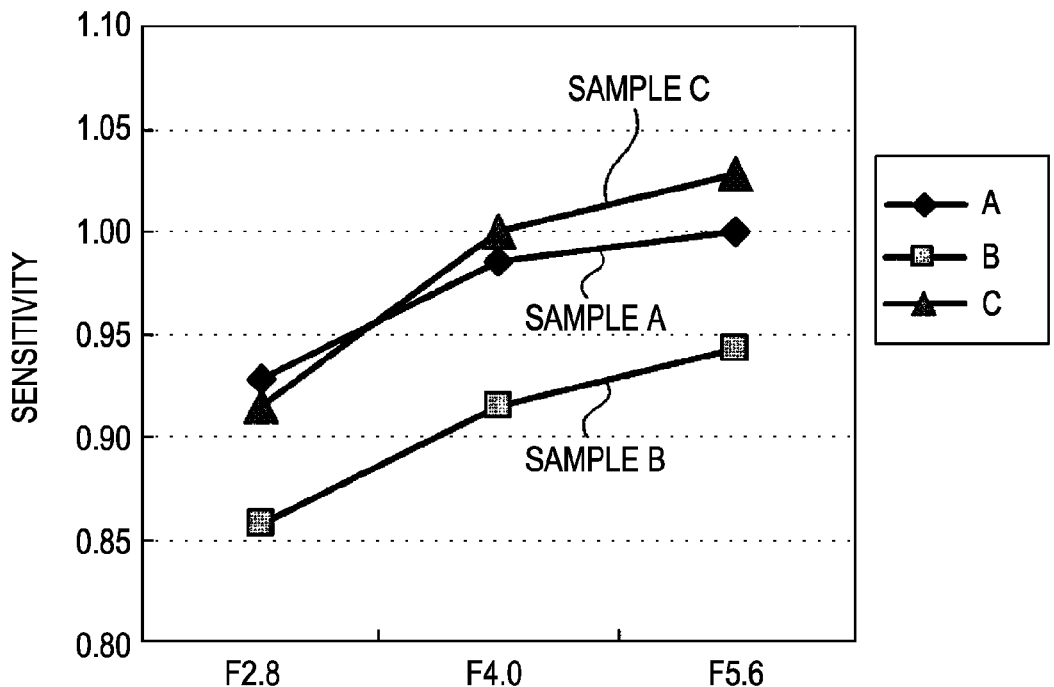
FIG. 7 is a graph showing the sensitivity characteristics, for comparing solid-state imaging devices desired, according to an embodiment of the present invention, and in the related art.
Figure 8:
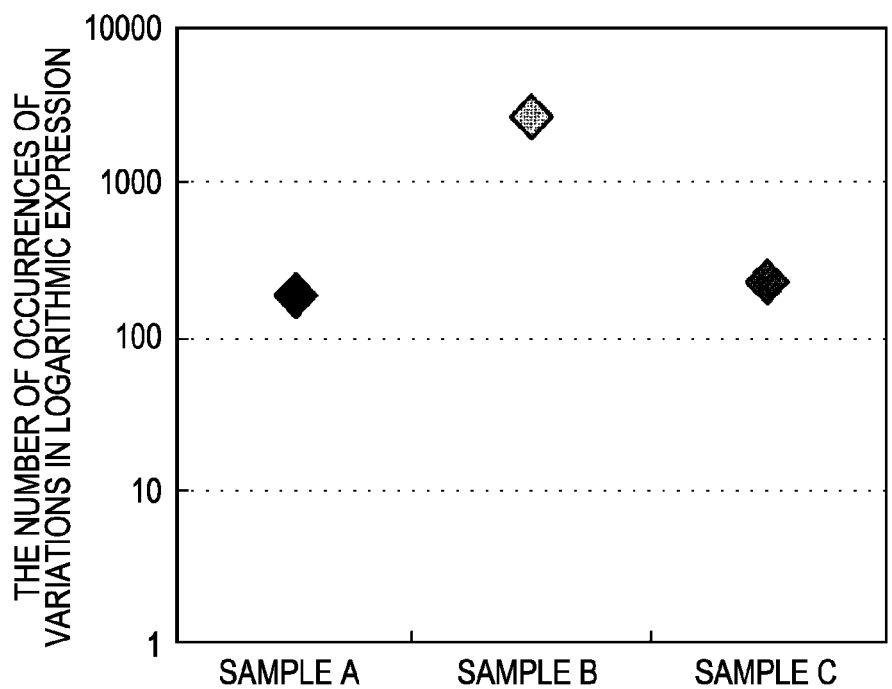
FIG. 8 is a graph showing the number of occurrences of image variations, for comparing solid-state imaging devices desired, according to an embodiment of the present invention, and in the related art.

FIG. 7 shows comparisons on sensitivity characteristics and FIG. 8 shows comparisons on statuses of occurrence of image variation. The individual FIG. 7 and FIG. 8 are graphs obtained on the basis of optical simulations. In the graphs, a solid-state imaging device (Sample A) including a desired waveguide, as shown in FIG. 9A, a solid-state imaging device (Sample B) including a waveguide in the related art, as shown in FIG. 9B, and a solid-state imaging device (Sample C) according to the first embodiment, as shown in FIG. 9C are compared.

Sample A is a solid-state imaging device including a desired waveguide 281 in which a core layer 27 having a refractive index n of 1.8 is embedded in a clad layer 26 having a refractive index of 1.4 while no void is present. Sample B is a solid-state imaging device including a waveguide 281 in which a core layer 27 having a refractive index n of 1.8 is embedded in a clad layer 26 having a refractive index of 1.4 while voids 140 are present. Sample C is a solid-state imaging device including a waveguide 28 in which the first film 271 having a refractive index n of 1.7 and the second film 272 having a refractive index of 1.8 are embedded in a clad layer 26 having a refractive index of 1.4 while no void is present.

Regarding the sensitivity characteristics shown in FIG. 7, the vertical axis indicates the sensitivity (relative value) and the horizontal axis indicates the individual F-numbers. According to the sensitivity characteristics shown in FIG. 7, Sample C (first embodiment) and Sample A (desired structure) exhibit nearly equal sensitivity characteristics. On the other hand, Sample B (structure in the related art) exhibits a poor sensitivity characteristic because voids 140 are present. In Sample C (first embodiment), diffuse reflection at a void does not occur and, therefore, the sensitivity characteristic is better than or equal to that of Sample A (desired structure).

In the graph related to image variation shown in FIG. 8, the vertical axis indicates the number of occurrences of image variations (logarithmic expression), and the horizontal axis indicates Samples A, B, and C. As is clear from FIG. 8, only the number of occurrences of image variations of Sample B (structure in the related art) is order-of-magnitude larger than others. On the other hand, Sample A (desired structure) and Sample C (first embodiment) are at the same level and the numbers of occurrences of image variations are order-of-magnitude smaller than that of Sample B.

Furthermore, according to the solid-state imaging device 1 in the first embodiment, the core layer 27 is configured to have a two-layer structure including the first film 271 having a low refractive index (n=1.7) as the lower layer and the second film 272 having a high refractive index (n=1.8) as the upper layer. According to this configuration, interfacial reflection at the interface between the low-refractive index silicon oxide film 23, which is the same as the clad layer 26 in the present example, on the antireflection film 22 and the high-refractive index core layer 27 is suppressed, so that the sensitivity characteristic is improved. As a matter of course, in the present embodiment, the low-refractive index silicon oxide film 23 is disposed between the high-refractive index antireflection film 22 and the high-refractive index core layer 27, so that the antireflection function is maintained and interfacial reflection at the surface of the antireflection film 22 can be suppressed.

Figure 10:
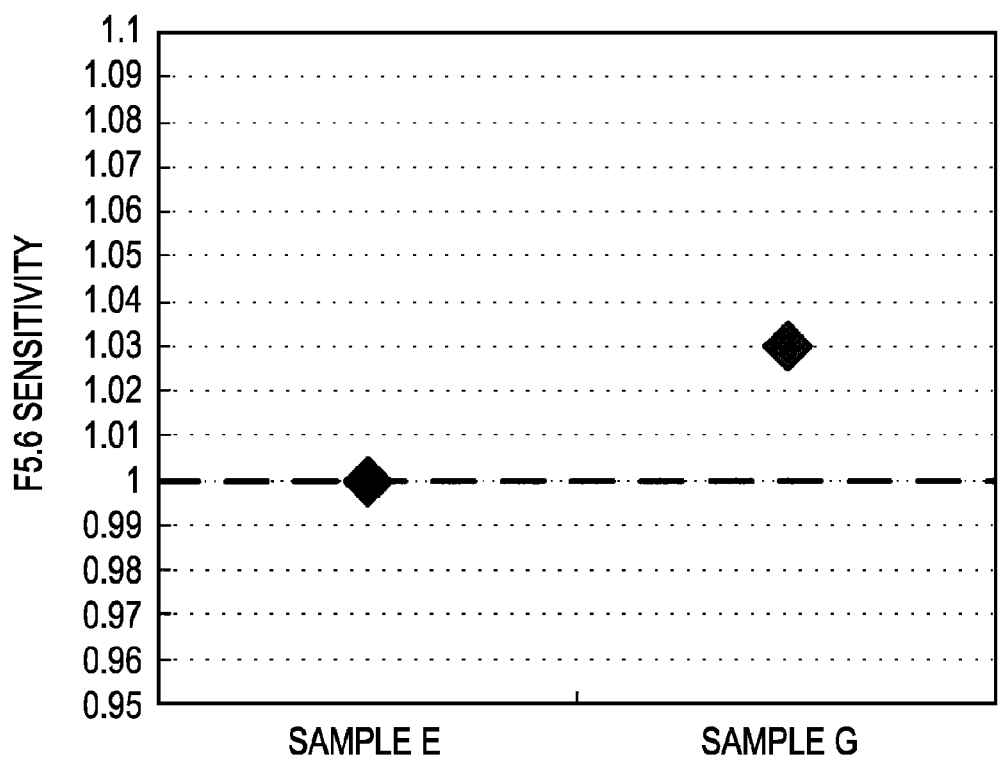
FIG. 10 is a graph showing the sensitivity characteristics, for comparing the first embodiment and an example in the related art.
Figure 11A:
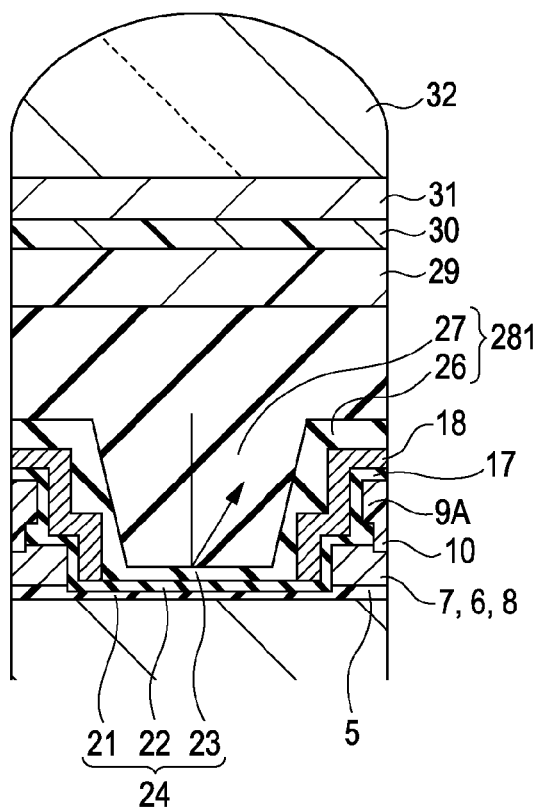
FIGS. 11A and 11B are sectional views of samples related to the graph shown in FIG. 10.
Figure 11B:
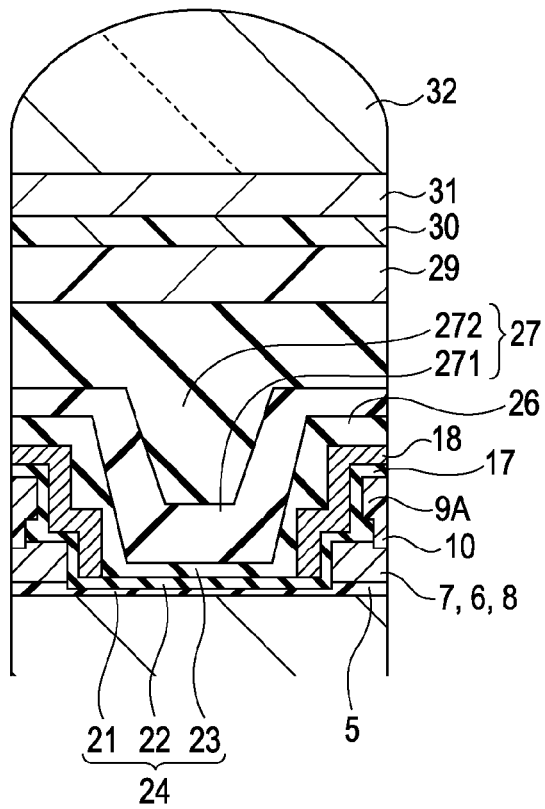

FIG. 10 shows comparison of sensitivity characteristics on the basis of the effect of the above-described interfacial reflection. FIG. 10 is a graph obtained by an optical simulation. In the graph, a solid-state imaging device (Sample E) including a waveguide in the related art, as shown in FIG. 11A, and a solid-state imaging device (Sample G) according to the first embodiment, as shown in FIG. 11B, are compared. Sample E is the same as Sample B described above. However, the presence of voids 140 is neglected. Sample G is the same as Sample C described above.

Figure 27:
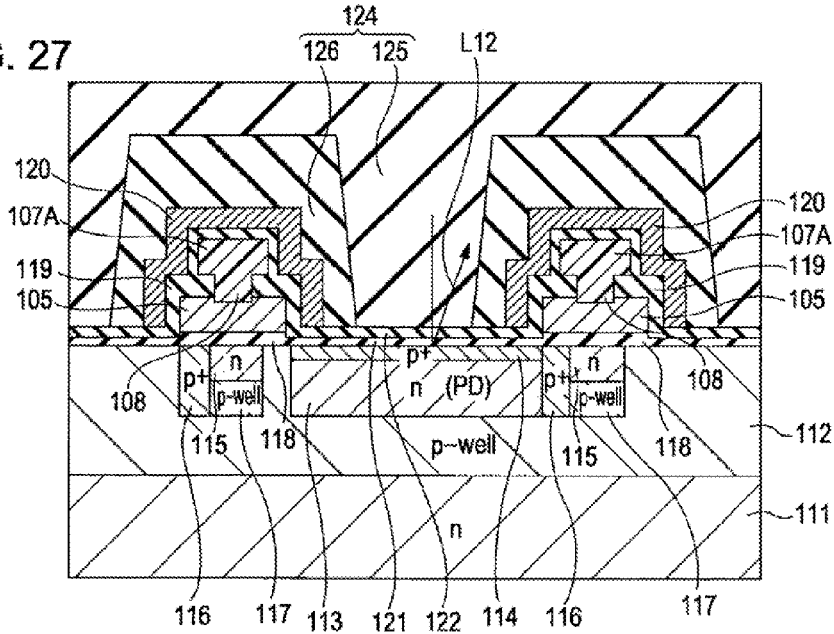
FIG. 27 is a sectional view for explaining problems of a solid-state imaging device according to a comparative example.
Figure 28:
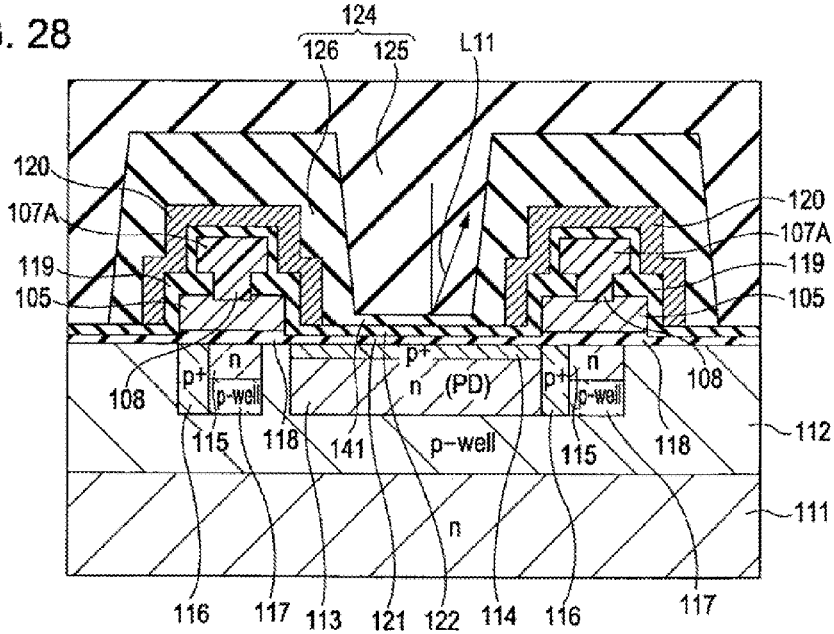
FIG. 28 is a sectional view for explaining problems of a solid-state imaging device according to an example in the related art.

In FIG. 10, the vertical axis indicates the F5.6 sensitivity (relative value) and the horizontal axis indicates Samples E and G. The following is made clear from FIG. 10. Regarding Sample E (structure in the related art), the low-refractive index silicon oxide film is disposed on the surface of the antireflection film and, therefore, interfacial reflection L12 (refer to FIG. 27) at the surface of the antireflection film is suppressed. However, interfacial reflection L11 (refer to FIG. 28) at the interface between the low-refractive index silicon oxide film and the high-refractive index core layer occurs and, thereby, the sensitivity characteristic is impaired. On the other hand, regarding Sample G (first embodiment), the low-refractive index first film 271 is disposed as the layer under the core layer 27 and, therefore, interfacial reflection L11 at the interface between the first film 271 and the low-refractive index silicon oxide film 23 thereunder is suppressed. Furthermore, since the low-refractive index silicon oxide film 23 is disposed on the surface of the antireflection film 22 in Sample G as well, interfacial reflection L12 at the surface of the antireflection film is suppressed. Consequently, Sample G according to the first embodiment can improve the sensitivity characteristic.

Moreover, regarding the solid-state imaging device according to the first embodiment, the sensitivity characteristic can be improved and the smear characteristic can be maintained at a nearly equal level without being deteriorated significantly.

Figure 12:
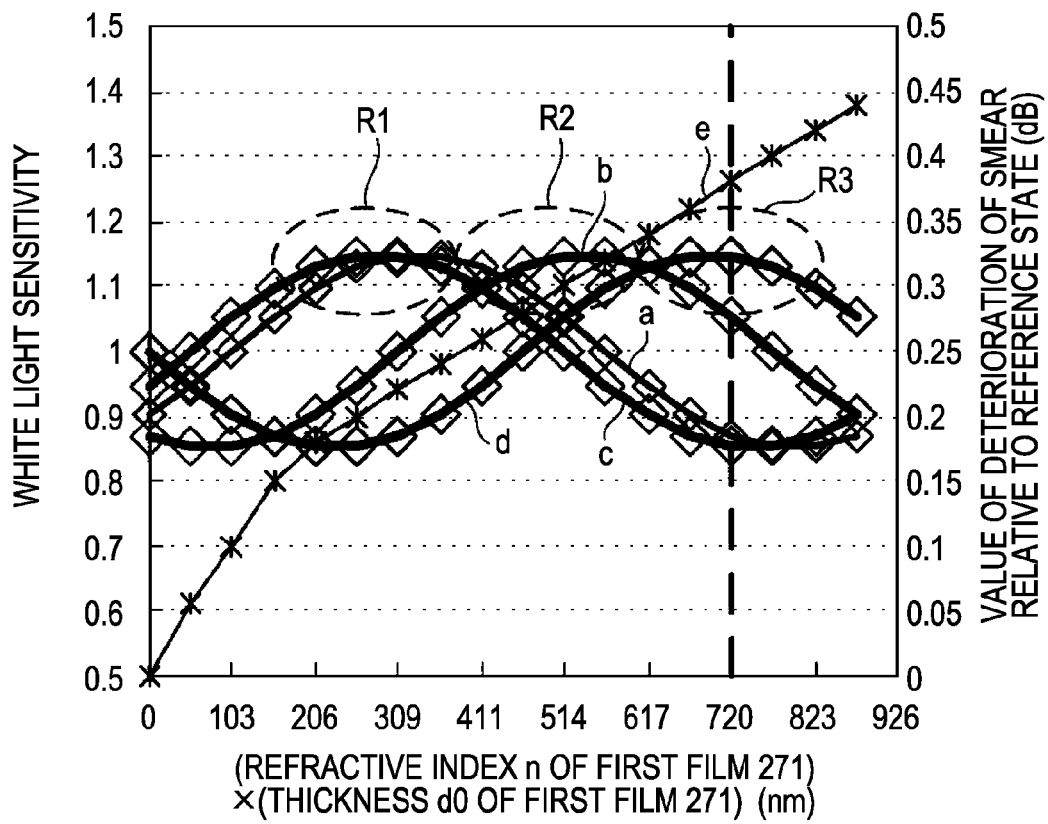
FIG. 12 is a graph showing the sensitivity characteristic and the smear characteristic of a solid-state imaging device according to an embodiment of the present invention.
Figure 13A:
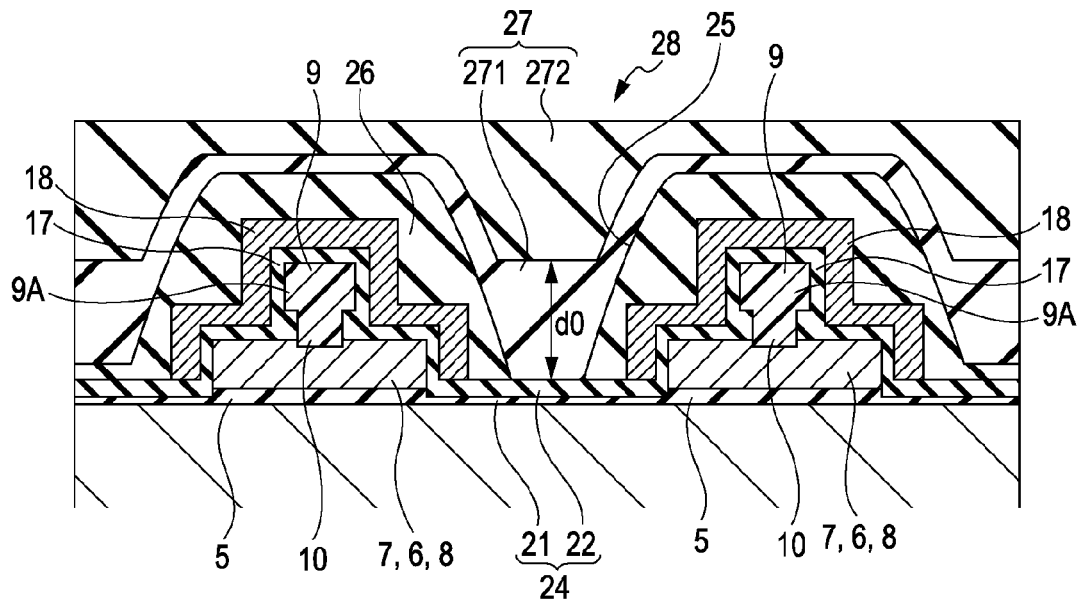
FIGS. 13A to 13D are sectional views of samples related to the graph shown in FIG. 12.
Figure 13B:
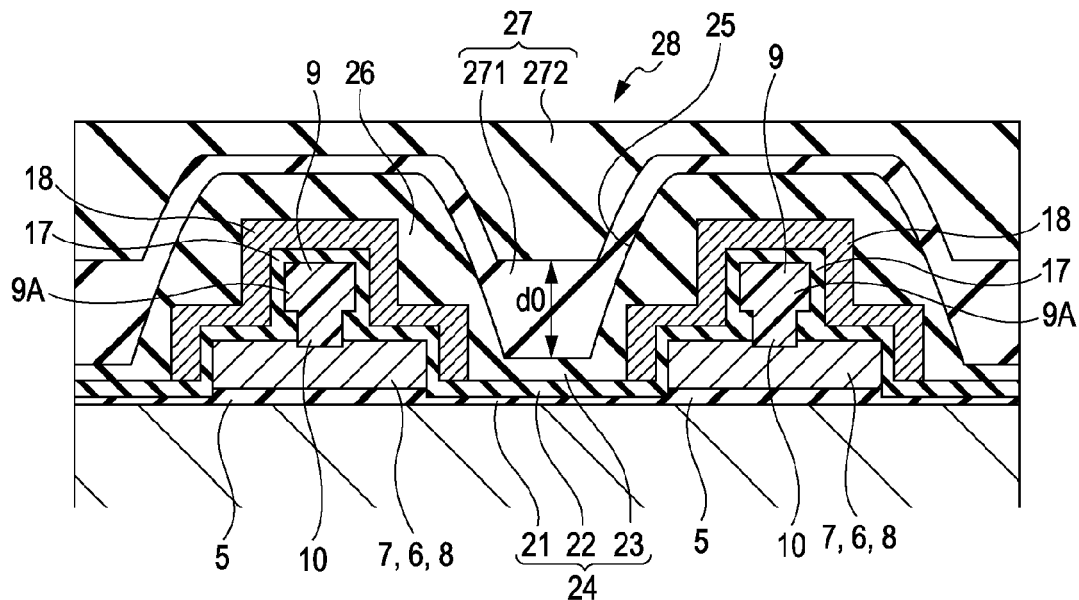
Figure 13C:
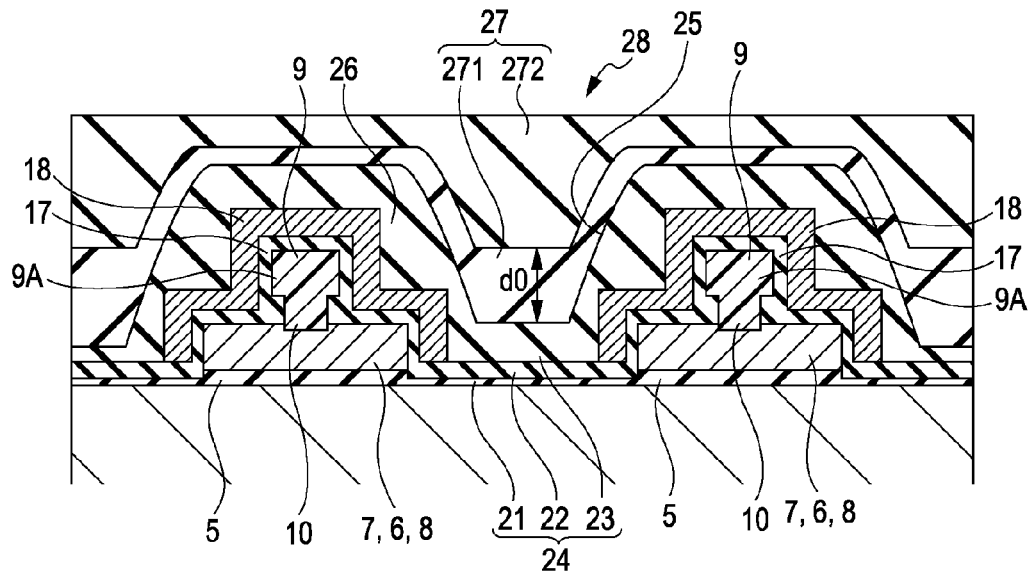
Figure 13D:
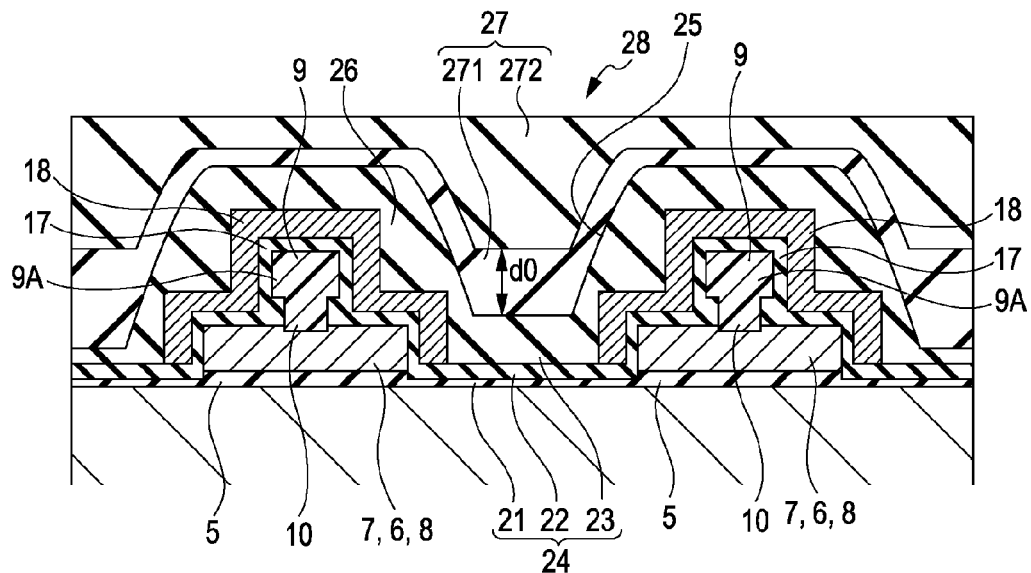

FIG. 12 shows comparisons on sensitivity characteristics and on smear characteristics. In the graph shown in FIG. 12, the horizontal axis indicates the value (nm) of (refractive index n of first film 271)×(thickness dO of first film 271), the left vertical axis indicates the white light sensitivity, and the right vertical axis indicates the value (dB) of deterioration of smear relative to the reference state. FIG. 12 shows the response of sensitivity and the response of smear in the case where the waveguide shape is changed variously and the thickness dO of the first film 271 of the core layer 27 is changed while the waveguide shape serves as the parameter. FIGS. 13A to 13D show the individual samples with different waveguide shapes, that is, samples with a waveguide shape 1 to a waveguide shape 4, respectively. In the waveguide shape 1 shown in FIG. 13A, the film thickness of the silicon oxide film 23 is 0 nm. In the waveguide shape 2 shown in FIG. 13B, the film thickness of the silicon oxide film 23 is 50 nm. In the waveguide shape 3 shown in FIG. 13C, the film thickness of the silicon oxide film 23 is 100 nm. In the waveguide shape 4 shown in FIG. 13D, the film thickness of the silicon oxide film 23 is 150 nm.

In FIG. 12, a curve a indicates the sensitivity characteristic with respect to the waveguide shape 1. A curve b indicates the sensitivity characteristic with respect to the waveguide shape 2. A curve c indicates the sensitivity characteristic with respect to the waveguide shape 3. A curve d indicates the sensitivity characteristic with respect to the waveguide shape 4. Furthermore a curve e indicates the smear characteristic with respect to the waveguide shape 1.

Regarding the horizontal axis, 720 nm is taken as the reference. When the value is 720 nm or less, as shown by regions R1, R2, and R3, there are conditions in which the sensitivity improvement effect is obtained although the smear characteristic is somewhat sacrificed. If the value exceeds 720 nm, as indicated by the curve e, an effect on the sensitivity becomes low and the smear characteristic deteriorates. Even when the value exceeds 720 nm, it is acceptable that the value is substantially less than or equal to the longest wavelength λ used in the solid-state imaging device. If the value exceeds λ, the smear characteristic deteriorates significantly.

2. Second Embodiment

Configuration Example of Solid-State Imaging Device

Figure 14:
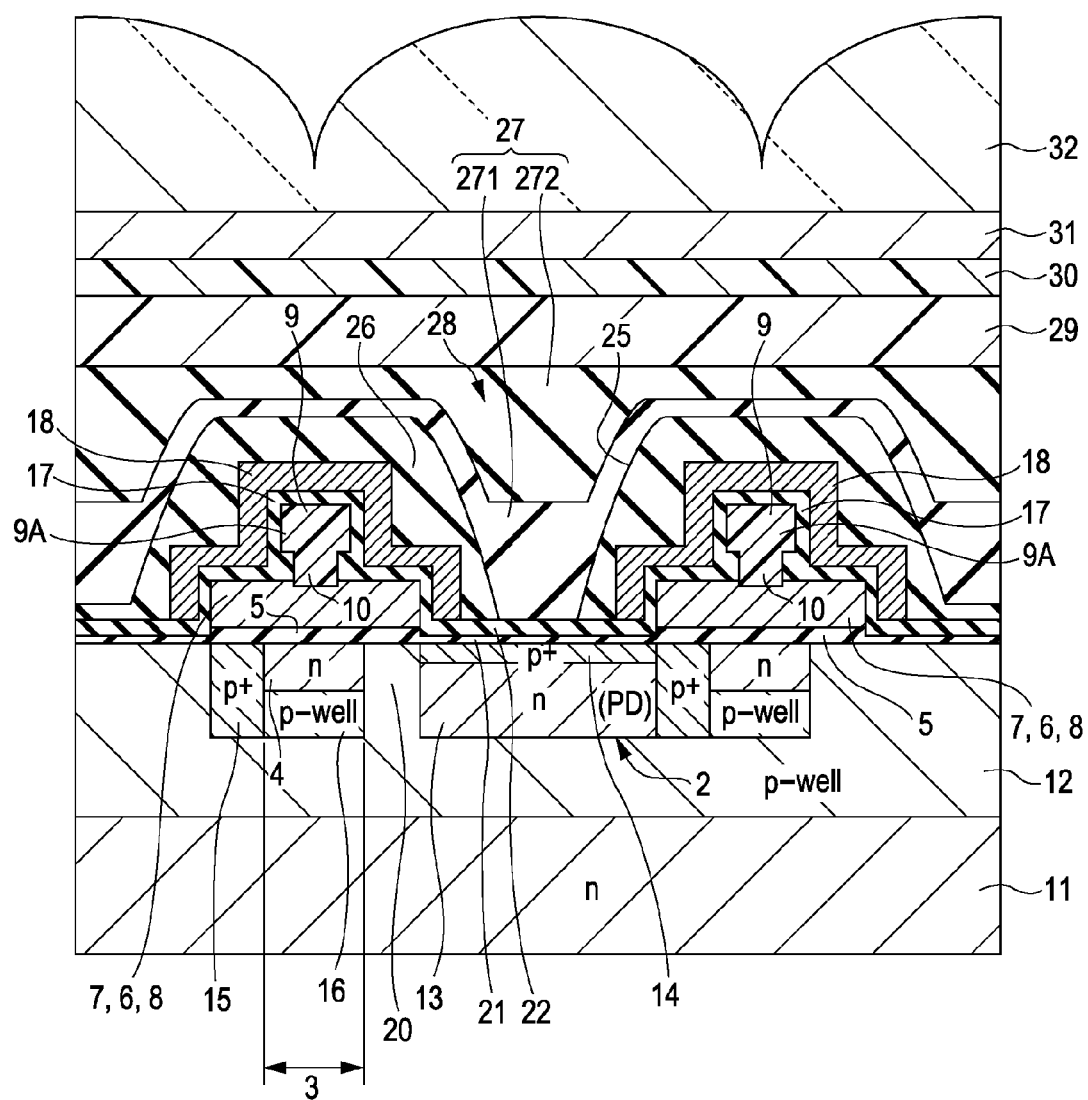
FIG. 14 is a sectional view of a key portion of a solid-state imaging device according to a second embodiment of the present invention.

FIG. 14 shows a second embodiment in which a solid-state imaging device according to an embodiment of the present invention is applied to a CCD solid-state imaging device.

FIG. 14 is a sectional view of a key portion of an imaging region of the CCD solid-state imaging device. In a solid-state imaging device 51 according to the present embodiment, a waveguide 28 including a clad layer 26 and a core layer 27 is disposed on a photodiode (PD) serving as a light-receiving portion 2, the core layer 27 including a first film 271 exhibiting good embeddability and having a relatively low refractive index and a second film 272 having a high refractive index. This waveguide 28 is the same waveguide as described in the first embodiment.

In the configuration of the present embodiment, in particular, a low-refractive index silicon oxide film 23 is not disposed on an antireflection film 22 and the first film 271 of the core layer 27 is in direct contact with the antireflection film 22. That is, the present embodiment is different from the first embodiment only in that a silicon oxide film 23 is not disposed between the first film 271 of the core layer 27 and the antireflection film 22 formed from a silicon nitride film. Other configuration is the same as that of the first embodiment and, therefore, in FIG. 14, the same elements as those in FIG. 2 are indicated by the same reference numerals as those set forth above and explanations thereof are not repeated.

The solid-state imaging device according to the second embodiment may be produced in a manner similar to that described with reference to FIGS. 4A and 4B and FIGS. 5A and 5B. However, in the step shown in FIG. 5A, when a trench portion 25 is formed in the clad layer 26, the trench portion 25 is formed in such a way as to expose the antireflection film 22. Thereafter, when the core layer 27 is formed, the film formation is conducted in such a way that the core layer 27 comes into contact with the antireflection film 22. In the case where the manufacturing method shown in FIGS. 6A and 6B is applied, in the film formation of the clad layer 26, the clad layer 26 is formed in such a way as to expose the antireflection film 22. Thereafter, the core layer 27 is formed in such a way as to come into contact with the antireflection film 22.

In the solid-state imaging device 51 according to the second embodiment as well, the waveguide 28 disposed on the antireflection film 22, in particular the core layer 27, is configured to include the first film 271 and the second film 272, which are formed by using the HDP film formation method while the D/S ratio is controlled. Therefore, the sensitivity characteristic is improved and image variations can be suppressed in a manner similar to that described in the first embodiment.

Figure 15:
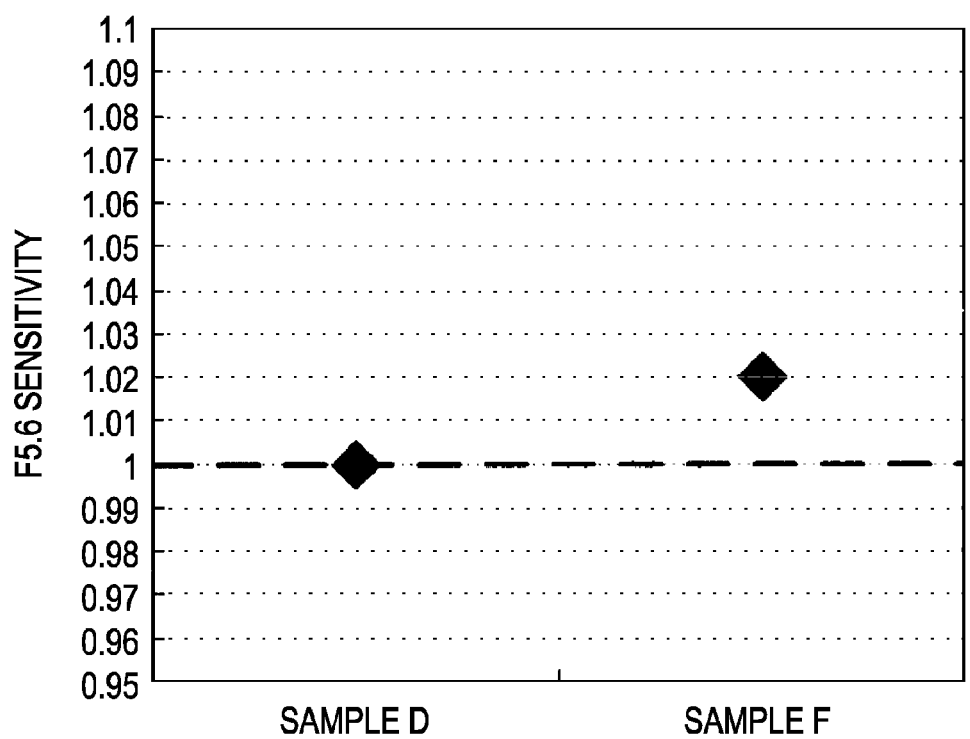
FIG. 15 is a graph showing the sensitivity characteristics, for comparing the second embodiment and an example in the related art.
Figure 16A:
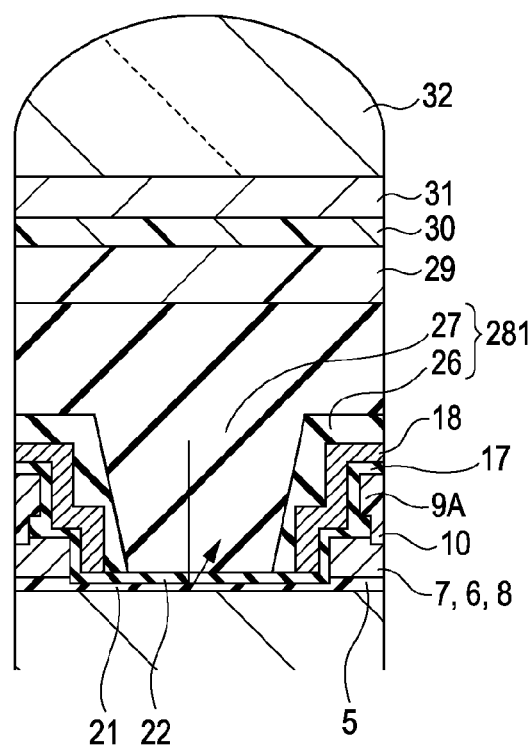
FIGS. 16A and 16B are sectional views of samples related to the graph shown in FIG. 15.
Figure 16B:
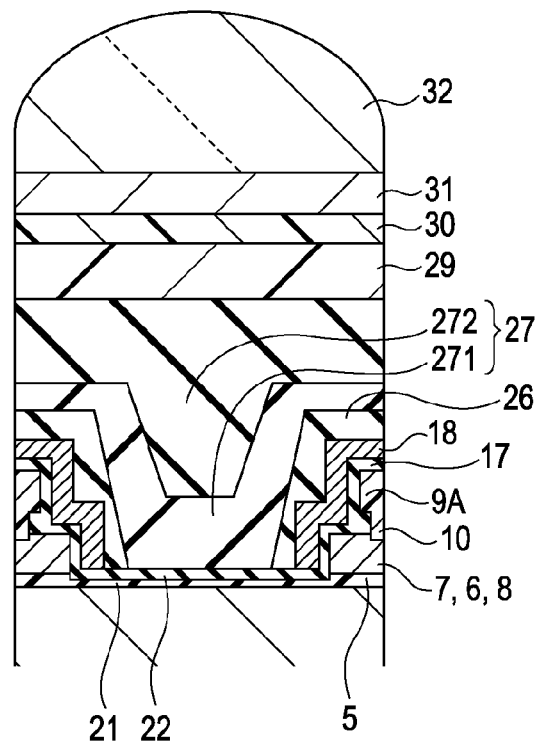

FIG. 15 shows comparison of sensitivity characteristics on the basis of the effect of interfacial reflection. FIG. 15 is a graph obtained by an optical simulation. In the graph, a solid-state imaging device (Sample D) including a waveguide in the related art, as shown in FIG. 16A and a solid-state imaging device (Sample F) according to the second embodiment, as shown in FIG. 16B are compared. Regarding Sample D, the presence of voids 140 is neglected.

In FIG. 15, the vertical axis indicates the F5.6 sensitivity (relative value) and the horizontal axis indicates Samples D and F. The following is made clear from FIG. 15. Regarding Sample D (structure in the related art), the high-refractive index core layer 27 is disposed directly on the antireflection film 22 and, therefore, interfacial reflection occurs at the interface between the antireflection film 22 and the core layer 27. Therefore, an antireflection effect is reduced and the sensitivity characteristic is not obtained. On the other hand, regarding Sample F (second embodiment), the low-refractive index first film 271 is disposed as the layer under the core layer 27. Consequently, interfacial reflection at the surface of the antireflection film is suppressed, the antireflection function is maintained, and the sensitivity characteristic can be improved.

Furthermore, the solid-state imaging device according to the second embodiment as well, it is desirable that the thickness dO of the first film 271 of the core layer 27 is specified in such a way as to satisfy the following formula.

$$0 \leq (\text{refractive index n of first film 271}) \times (\text{thickness dO of first film 271}) \leq 720 \text{ nm}$$

In this regard, the upper limit is not necessarily 720 nm, but may be a value substantially less than or equal to the longest wavelength λ used in the solid-state imaging device.

Consequently, as in the case of the solid-state imaging device according to the first embodiment, the sensitivity characteristic can be improved and the smear characteristic can be improved as shown in FIG. 12.

3. Third Embodiment

Configuration Example of Solid-State Imaging Device

Figure 17:
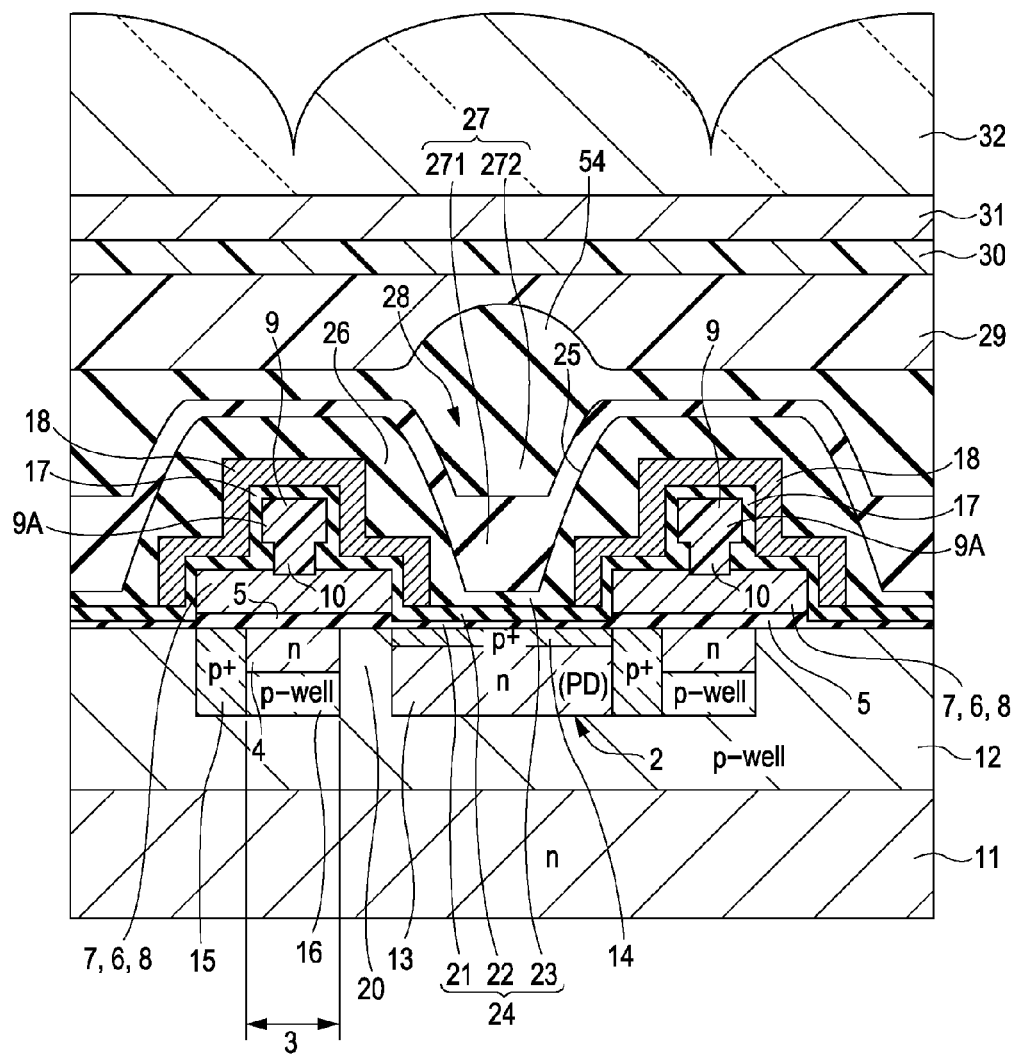
FIG. 17 is a sectional view of a key portion of a solid-state imaging device according to a third embodiment of the present invention.

FIG. 17 shows a third embodiment in which a solid-state imaging device according to an embodiment of the present invention is applied to a CCD solid-state imaging device. FIG. 17 is a sectional view of a key portion of an imaging region of the CCD solid-state imaging device. In a solid-state imaging device 53 according to the present embodiment, an intra-layer lens 54 is further disposed on the above-described waveguide 28. That is, regarding the solid-state imaging device 53 according to the present embodiment, a waveguide 28 is disposed on a photodiode (PD) serving as a light-receiving portion 2 while including a clad layer 26 and a core layer 27 embedded in the trench portion of the clad layer 26. The core layer 27 includes a first film 271 and a second film 272. The first film 271 serving as the lower layer constituting the core layer exhibits good embeddability and has a relatively low refractive index and the second film 272 serving as the upper layer has a refractive index higher than that of the first film 271. These first and the second films 271 and 272 are formed continuously in the same chamber by the HDP film formation method in a manner similar to that described in the first embodiment. That is, this waveguide 28 is the same waveguide as that described in the first embodiment. In the case where the first film 271 and the second film 272 are formed continuously in the same chamber by the HDP film formation method, the number of steps is reduced and, therefore, the production can be simplified.

Then, in the present embodiment, the intra-layer lens 54 is disposed on the waveguide 28. In the present example, the intra-layer lens 54 is formed into the shape of a convex lens and is formed from the same silicon nitride film as that for the second film 272. A passivation film 29 is disposed all over the surface including the intra-layer lens 54, and an on-chip color filter 31 and an on-chip microlens 32 are disposed thereon with a planarizing film 30 therebetween.

Other configuration is the same as that described in the above-described first embodiment and, therefore, the same elements corresponding to those in FIG. 2 are indicated by the same reference numerals as those set forth above and explanations thereof are not repeated.

In the solid-state imaging device 53 according to the third embodiment, the intra-layer lens 54 is disposed on the waveguide 28 and, therefore, the efficiency of light condensation on the photodiode (PD) further increases and the sensitivity is improved. In addition, the first film 271 and the second film 272 are formed by the HDP film formation method and, thereby, the core layer 27 can be embedded with no void. Consequently, the same effects as those described in the first embodiment are exerted. For example, the sensitivity characteristic is improved, image variations are suppressed, and the smear characteristic is improved.

In this regard, the solid-state imaging device 51 according to the above-described second embodiment may also be configured to include the intra-layer lens 54 on the waveguide 28, although not shown in the drawing.

4. Fourth Embodiment

Configuration Example of Solid-State Imaging Device

Figure 18:
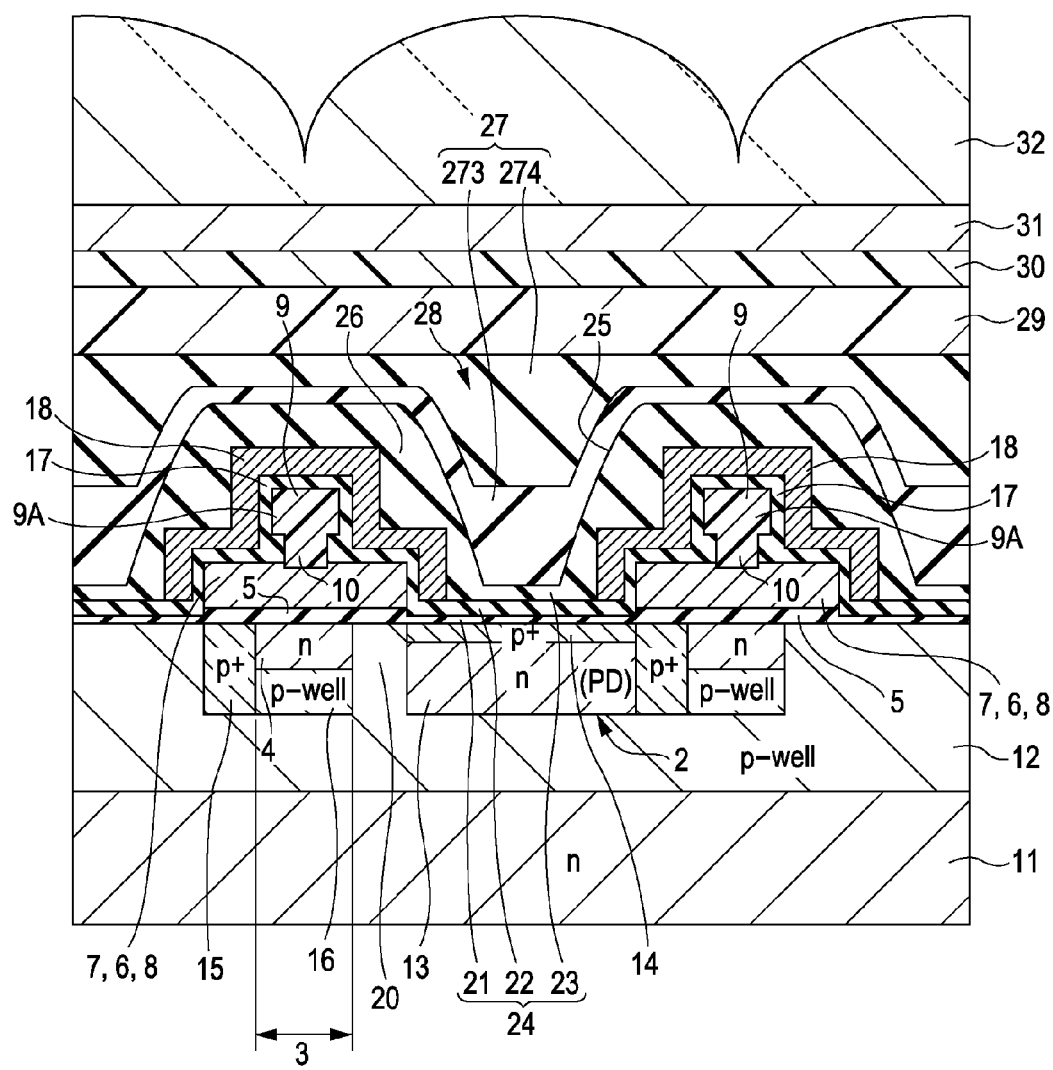
FIG. 18 is a sectional view of a key portion of a solid-state imaging device according to a fourth embodiment of the present invention.

FIG. 18 shows a fourth embodiment in which a solid-state imaging device according to an embodiment of the present invention is applied to a CCD solid-state imaging device. FIG. 18 is a sectional view of a key portion of an imaging region of the CCD solid-state imaging device. In a solid-state imaging device 55 according to the present embodiment, a waveguide 28 is disposed on a photodiode (PD) serving as a light-receiving portion 2 while including a clad layer 26 and a core layer 27 embedded in the trench of the clad layer 26. The core layer 27 includes a first film 273 and a second film 274. The first film 273 serving as the lower layer of the core layer exhibits good embeddability and has a relatively low refractive index and the second film 274 serving as the upper layer has a refractive index higher than that of the first film 273.

In the present embodiment, the first film 273 serving as the lower layer constituting the core layer 27 is formed by the HDP film formation method as in the above description. The first film 273 is formed from a film exhibiting good embeddability and having a relatively low refractive index while the D/S ratio is controlled. On the other hand, the second film 274 serving as the upper layer constituting the core layer 27 is formed by a plasma CVD method through the use of a parallel plate electrodes (hereafter referred to as a parallel plate plasma CVD method).

The first film 273 is formed by the HDP film formation method from, for example, a silicon oxynitride (SiON) film or a silicon nitride (SiN) film. The refractive index of the silicon oxynitride film or the silicon nitride film can be adjusted from 1.5 to 1.8 by the film formation condition in the HDP film formation. The second film 274 is formed by the parallel plate plasma CVD method from, for example, a silicon nitride (SiN) film or a silicon carbide (SiC) film. The second film 274 has such film characteristics that good adhesion to the first film 273 is exhibited and the refractive index is higher than the refractive index of the first film 273. The refractive index of the above-described second film 274 formed by the parallel plate plasma CVD method exceeds 1.8 and, for example, the refractive index of about 1.9 to 2.1 is obtained.

Examples of material films used for the second film 274 having a refractive index N higher than that of, for example, a HDP-SiON film (N=1.7) serving as the first film 273 include the following insulating films, besides those described above. A numerical value in parentheses indicates the refractive index. As for the material film for the second film 274, an insulating film containing at least one element of hafnium (1.95), aluminum (1.76), tantalum (2.16), titanium (2.5), yttrium (1.82), and lanthanoid (1.88) elements may be used. These insulating films exhibit good adhesion to the first film 273. The core layer 26 is formed from a silicon oxide film having a refractive index of, for example, about 1.45.

A passivation film 29 is disposed on the upper surface including the waveguide 28, and an on-chip color filter 31 and an on-chip microlens 32 are disposed thereon by lamination with a planarizing film 30 therebetween. Other configuration is the same as that described in the above-described first embodiment and, therefore, the elements corresponding to those in FIG. 2 are indicated by the same reference numerals as those set forth above and explanations thereof are not repeated.

Example of Method for Manufacturing Solid-State Imaging Device

Figure 19A:
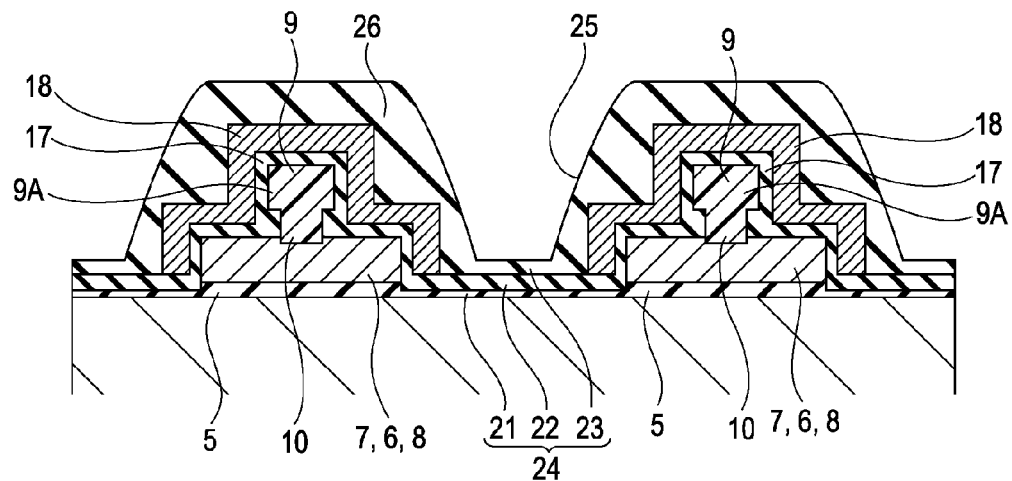
FIGS. 19A and 19B are production step diagrams showing an example of a method for manufacturing a solid-state imaging device according to the fourth embodiment.

FIG. 19A to FIG. 20B show a method for manufacturing a solid-state imaging device 55 according to the fourth embodiment, in particular a method for manufacturing a waveguide. In the present embodiment, as shown in FIG. 19A, a photodiode (PD), transfer electrodes 6 to 8, connection wirings 9, an insulating film 17, a light-shielding film 18, and the like are formed on a semiconductor substrate in a manner similar to that described with reference to FIG. 6A. After the above-described state, the clad layer 26 constituting the waveguide is formed following the surface of the laminated structure around the concave portion in accordance with the light-receiving portion 2. As for the clad layer 26, a silicon oxide film having a refractive index of, for example, 1.45 is formed.

Figure 19B:
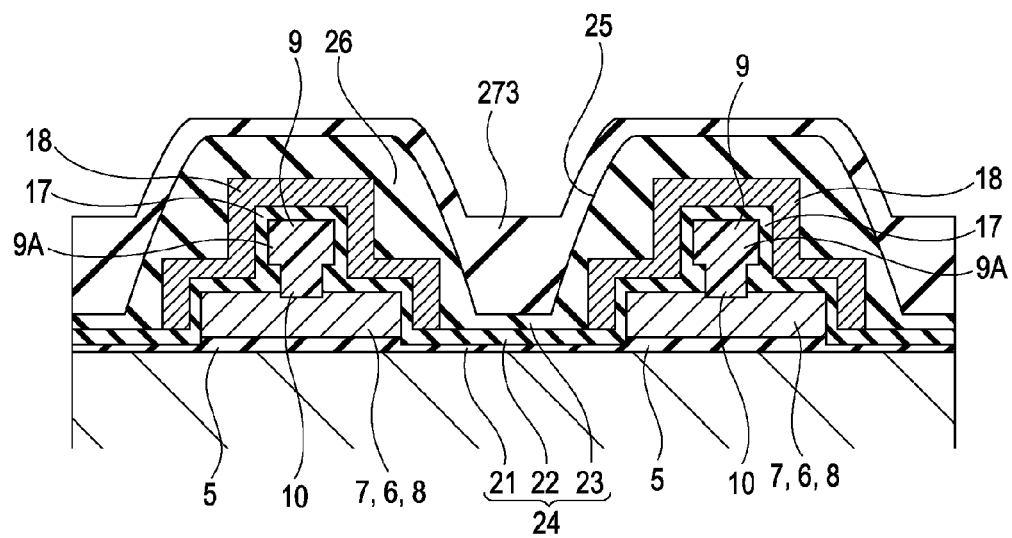

Next, as shown in FIG. 19B, the first film 273 is formed by the HDP film formation method exhibiting high embeddability in such a way as to raise the bottom of the trench of the clad layer 26. As for the HDP film formation condition, for example, temperature: 200° C. to 800° C., RF power: 1 kW to 10 kW, RF bias power: 1 kW to 10 kW, pressure: 2 mTorr to 50 mTorr, and type of gas: $SiH_4$, $O_2$, $N_2$, $NH_3$, Ar, and He are employed. The SiON film or the SiN film is formed under the above-described HDP film formation condition. The refractive index of the SiON film or the SiN film formed by the HDP film formation method can be adjusted from 1.5 to 1.8 by the film formation condition.

Figure 20A:
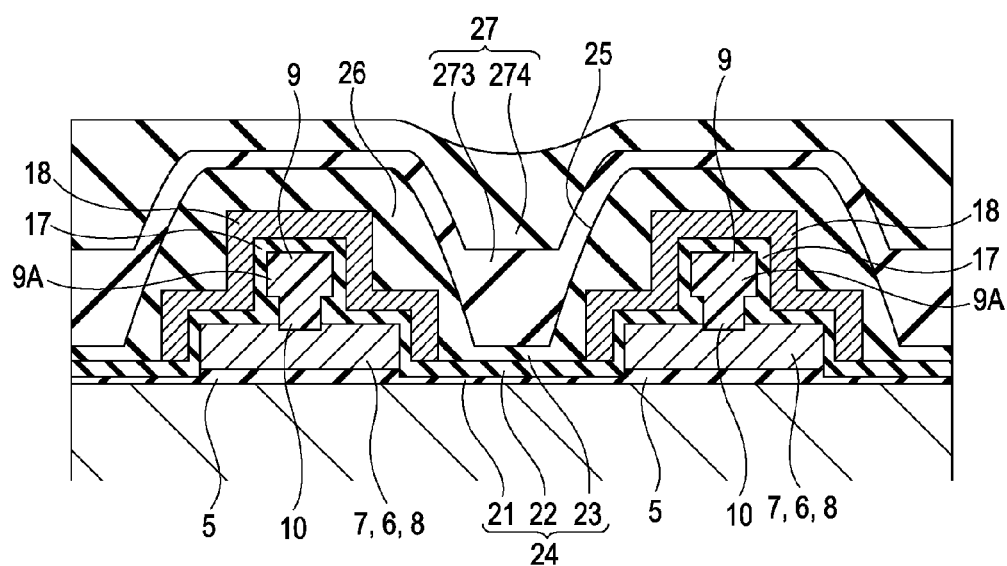
FIGS. 20A and 20B are production step diagrams showing an example of a method for manufacturing a solid-state imaging device according to the fourth embodiment.

Then, as shown in FIG. 20A, after the HDP film formation, for example, a silicon nitride (SiN) film serving as the high-refractive index second film 274 is formed all over the upper surface by the parallel plate plasma CVD method in such a way as to fill the inside of the trench portion. As for the plasma SiN film formation condition, for example, temperature: 200° C. to 800° C., high-frequency RF power: 100 W to 1,500 W, low-frequency RF bias power: 100 W to 1,500 W, pressure: 2 Torr to 10 Torr, and type of gas: $SiH_4$, $N_2$, $NH_3$, He and $O_2$ are employed. The SiN film is formed under the above-described film formation condition. Here, in the above-described example, the film formation is conducted by plasma SiN. However, the material is not limited to the plasma SiN film insofar as the material is a core material having a refractive index higher than that of the first film 273 formed by the HDP film formation method, that is, a high-refractive index core material having a refractive index exceeding 1.8. As for other materials, the above-described insulating films can be used.

Figure 20B:
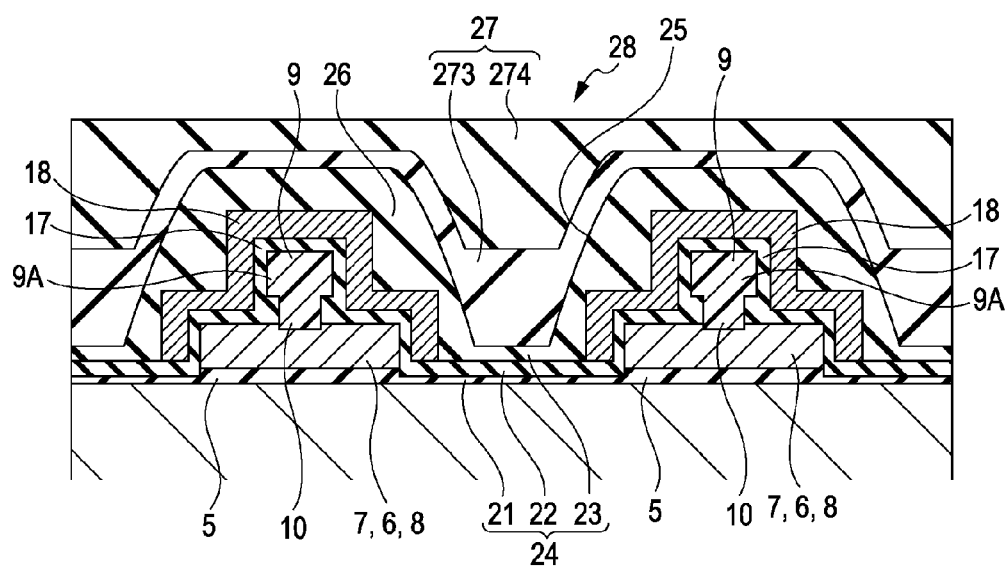

Subsequently, as shown in FIG. 20B, after the second film 274 is formed, the second film 274 is flattened by using a technique of an etch-back treatment, chemical mechanical polishing (CMP), or the like. Thereafter, a passivation film 29, a planarizing film 30, an on-chip color filter 31, and an on-chip microlens 32 are formed, so that the desired solid-state imaging device 55 is obtained.

According to the solid-state imaging device 55 in the fourth embodiment, the first film 273 constituting the core layer 27 of the waveguide 28 is formed by the HDP film formation method. Therefore, the first film 273 can be embedded into the bottom of the trench of the clad layer 26 with good embeddability. Furthermore, the second film 274 constituting the core layer 27 of the waveguide 28 is formed by the parallel plate plasma CVD method and, therefore, a high-refractive index second film 274 having a refractive index exceeding 1.8 can be formed. Consequently, the refractive index of the core layer 27 becomes higher, so that the light condensation efficiency of the waveguide 28 increases.

As the refractive index of the core layer 27 becomes higher, the light condensation efficiency of the waveguide 28 increases. The light incident on a so-called edge of the viewing angle, which corresponds to a peripheral portion of the effective pixel region of the solid-state imaging device, is slant light. Therefore, it is difficult to condense the light. Consequently, smear tends to increase at the edge of the viewing angle. However, in the present embodiment, the light condensation efficiency can be increased by increasing the refractive index of the core layer 27, so that smear at the edge of the viewing angle can be reduced.

As the thickness of, for example, the SiON film formed by the HDP film formation method becomes smaller, peeling of the film does not occur easily. In the fourth embodiment, only the first film 273 is formed from a film by the HDP film formation method. Therefore, the film thickness can be reduced as compared with that in the case where all core layers are formed from films by the HDP film formation method in which large stress is applied and, thereby, peeling of the film can be prevented. In the case where the total thickness of the core layer 27 is specified to be 700 nm to 800 nm, the film thickness of the first film 273 can be reduced to about 200 nm. Consequently, a highly reliable waveguide can be formed, so that a highly reliable solid-state imaging device can be provided.

In the case where the first film 273, which is formed from a film by the HDP film formation method exhibiting good embeddability, is embedded into the bottom portion of the core layer of the waveguide 28 so as to raise the bottom and reduce the aspect ratio of embedding, even a high-refractive index material exhibiting low embeddability can be embedded on the first film 273. Consequently, a waveguide structure having a higher light condensation efficiency can be formed.

In addition, the same effects as those described in the first embodiment are exerted. For example, the core layer 27 can be embedded with no void, the sensitivity characteristic is improved, image variations are suppressed, and the smear characteristic is improved.

5. Fifth Embodiment

Configuration Example of Solid-State Imaging Device

Figure 21:
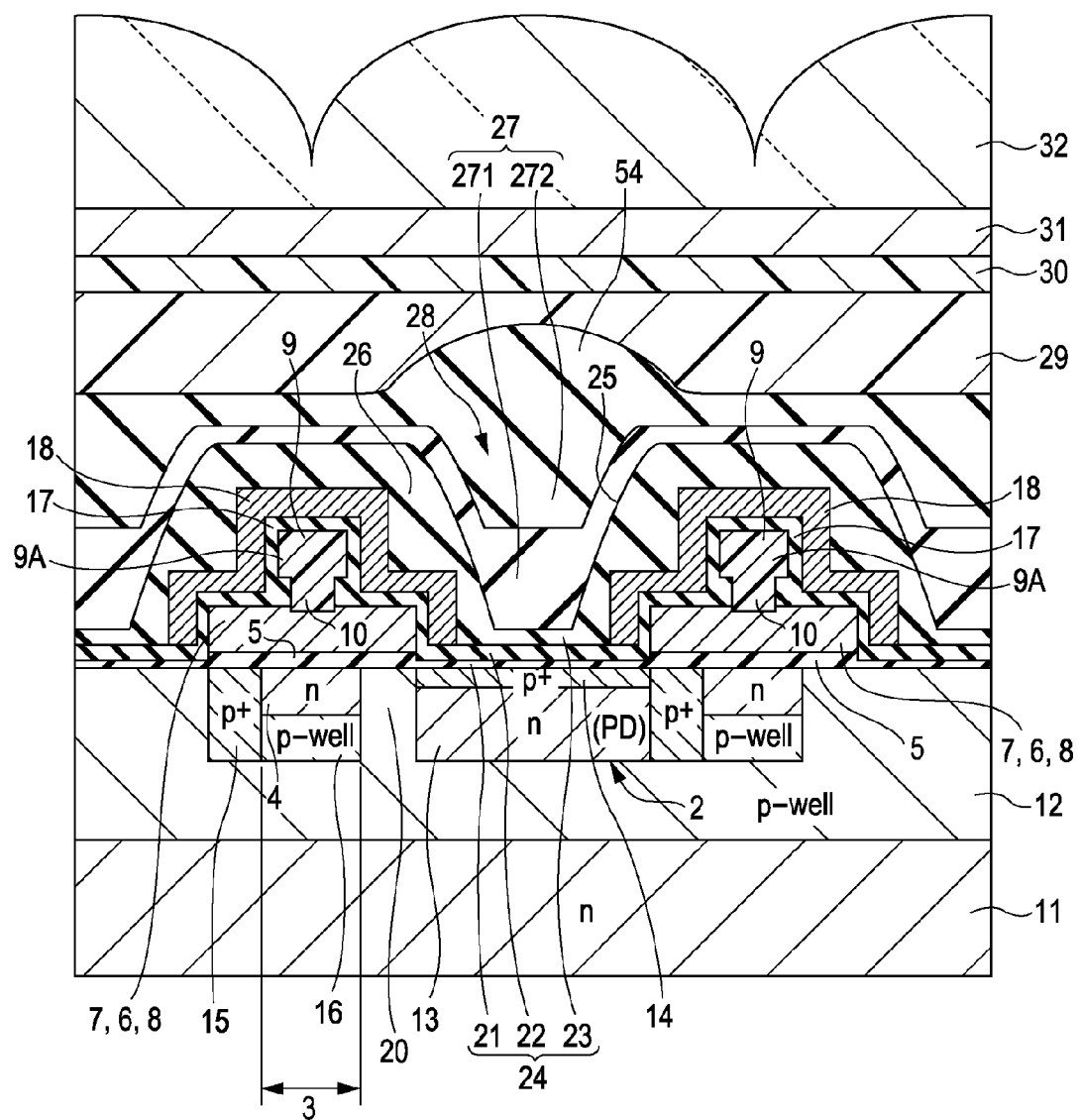
FIG. 21 is a sectional view of a key portion of a solid-state imaging device according to a fifth embodiment of the present invention.

FIG. 21 shows a fifth embodiment in which a solid-state imaging device according to an embodiment of the present invention is applied to a CCD solid-state imaging device. FIG. 21 is a sectional view of a key portion of an imaging region of the CCD solid-state imaging device. In a solid-state imaging device 57 according to the present embodiment, an intra-layer lens 54 is further disposed on the waveguide 28 in the above-described fourth embodiment. That is, regarding the solid-state imaging device 57 according to the present embodiment, a waveguide 28 is disposed on a photodiode (PD) serving as a light-receiving portion 2 while including a clad layer 26 and a core layer 27 embedded in the trench portion of the clad layer 26. The core layer 27 includes a first film 273 and a second film 274. The first film 273 serving as the lower layer constituting the core layer exhibits good embeddability and has a relatively low refractive index and the second film 274 serving as the upper layer has a refractive index higher than that of the first film 273.

The first film 273 serving as the lower layer constituting the core layer 27 is formed by the HDP film formation method as in the above description. The first film 273 is formed from a film exhibiting good embeddability and having a relatively low refractive index while the D/S ratio is controlled. On the other hand, the second film 274 serving as the upper layer constituting the core layer 27 is formed by a plasma CVD method through the use of a parallel plate electrodes (hereafter referred to as a parallel plate plasma CVD method). The materials and the refractive indices of each of the clad layer 26 and the first film 273 and the second film 274, which constitute the core layer 27, are the same as those described in the fourth embodiment and, therefore, explanations thereof are not repeated.

Then, in the present embodiment, the intra-layer lens 54 is disposed on the waveguide 28. In the present example, the intra-layer lens 54 is formed into the shape of a convex lens and is formed from the same silicon nitride film as that for the second film 274. A passivation film 29 is disposed all over the surface including the intra-layer lens 54, and an on-chip color filter 31 and an on-chip microlens 32 are disposed thereon with a planarizing film 30 therebetween.

Other configuration is the same as that described in the above-described fourth embodiment and, therefore, the same elements corresponding to those in FIG. 18 are indicated by the same reference numerals as those set forth above and explanations thereof are not repeated.

Example of Method for Manufacturing Solid-State Imaging Device

Figure 22A:
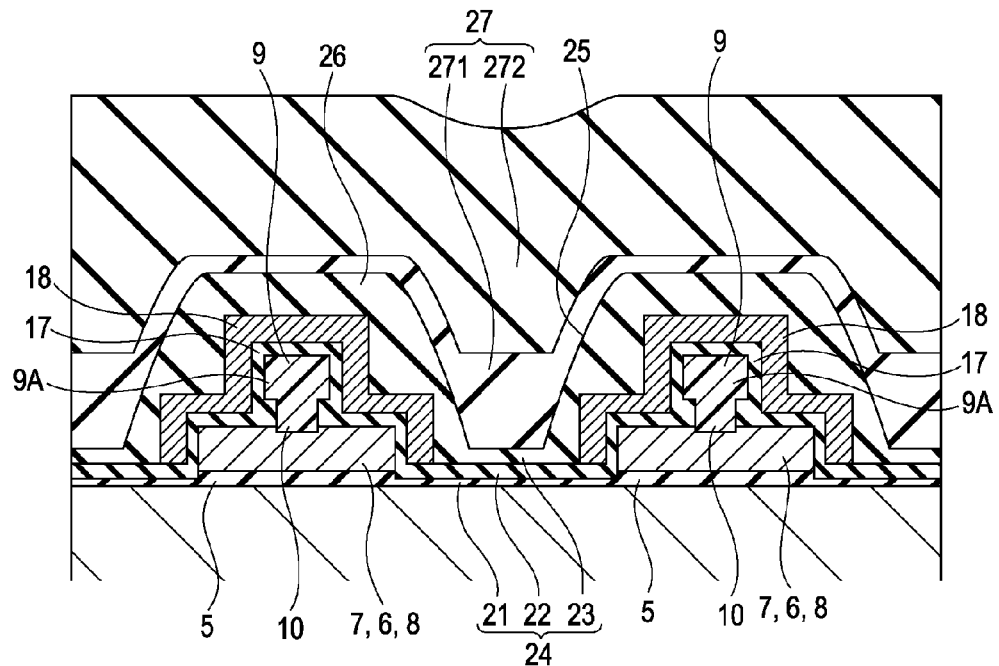
FIGS. 22A and 22B are production step diagrams showing an example of a method for manufacturing a solid-state imaging device according to the fifth embodiment.

FIG. 22A to FIG. 23B show a method for manufacturing a solid-state imaging device 57 according to the fifth embodiment, in particular a method for manufacturing a waveguide and an intra-layer lens. The step shown in FIG. 22A corresponds to the step shown in FIG. 20A described above. That is, in the present embodiment, as shown in FIG. 22A, a photodiode (PD), transfer electrodes 6 to 8, connection wirings 9, an insulating film 17, a light-shielding film 18, and the like are formed on a semiconductor substrate. After the above-described state, the clad layer 26 constituting the waveguide is formed following the surface of the laminated structure around the concave portion in accordance with the light-receiving portion 2. As for the clad layer 26, a silicon oxide film having a refractive index of, for example, 1.45 is formed.

Next, the first film 271 is formed by the HDP film formation method exhibiting high embeddability in such a way as to raise the bottom of the trench of the clad layer 26. The HDP film formation condition at this time is the same as that described in the HDP film formation condition in the fourth embodiment. Then, after the HDP film formation, for example, a silicon nitride (SiN) film serving as the high-refractive index second film 272 is formed all over the upper surface by the parallel plate plasma CVD method in such a way as to fill the inside of the trench portion. The plasma SiN film formation condition at this time is the same as the plasma SiN film formation condition described in the fourth embodiment.

Figure 22B:
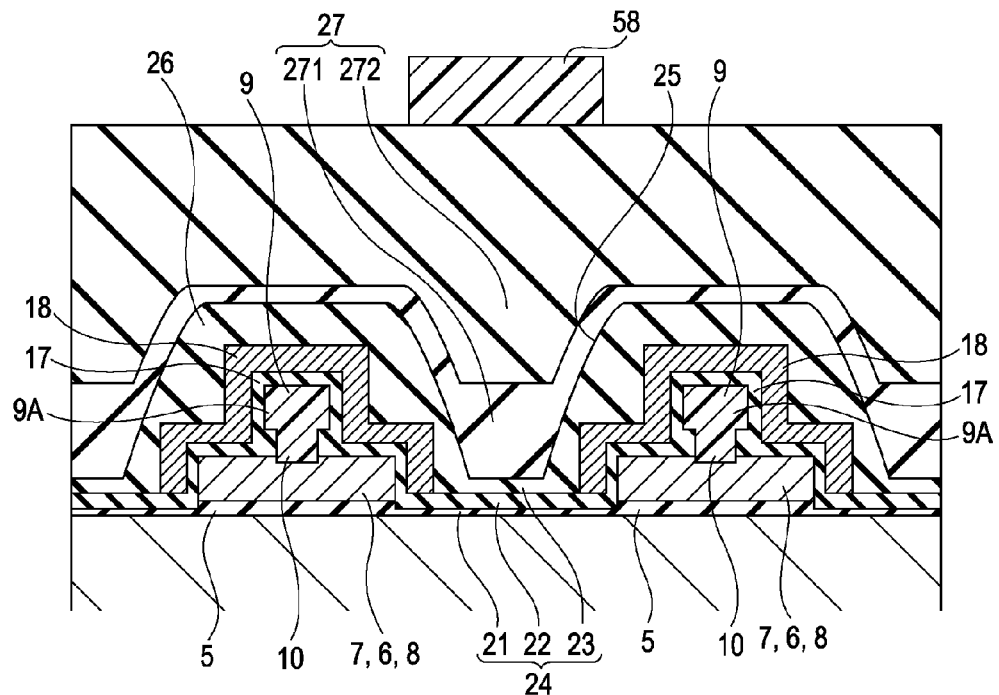

Subsequently, as shown in FIG. 22B, after the second film 272 is formed, the second film 272 is flattened by using a technique of an etch-back treatment, chemical mechanical polishing (CMP), or the like. In this manner, the waveguide 28 composed of the clad layer 26 and the core layer 27, which includes the first film 271 and the second film 272, is formed. Thereafter, a photoresist film 58 is formed selectively on a portion in accordance with the waveguide 28 on the flattened second film 272.

Figure 23A:
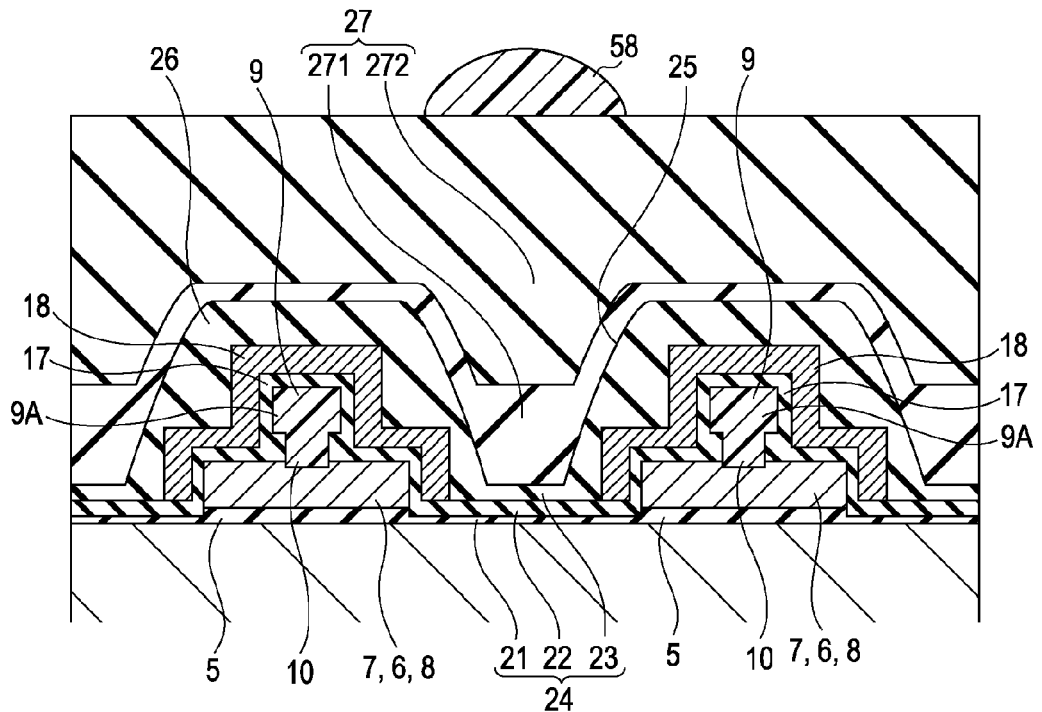
FIGS. 23A and 23B are production step diagrams showing an example of a method for manufacturing a solid-state imaging device according to the fifth embodiment.

Then, as shown in FIG. 23A, the photoresist film 58 is subjected to a reflow treatment so as to be formed into the shape of a lens.

Figure 23B:
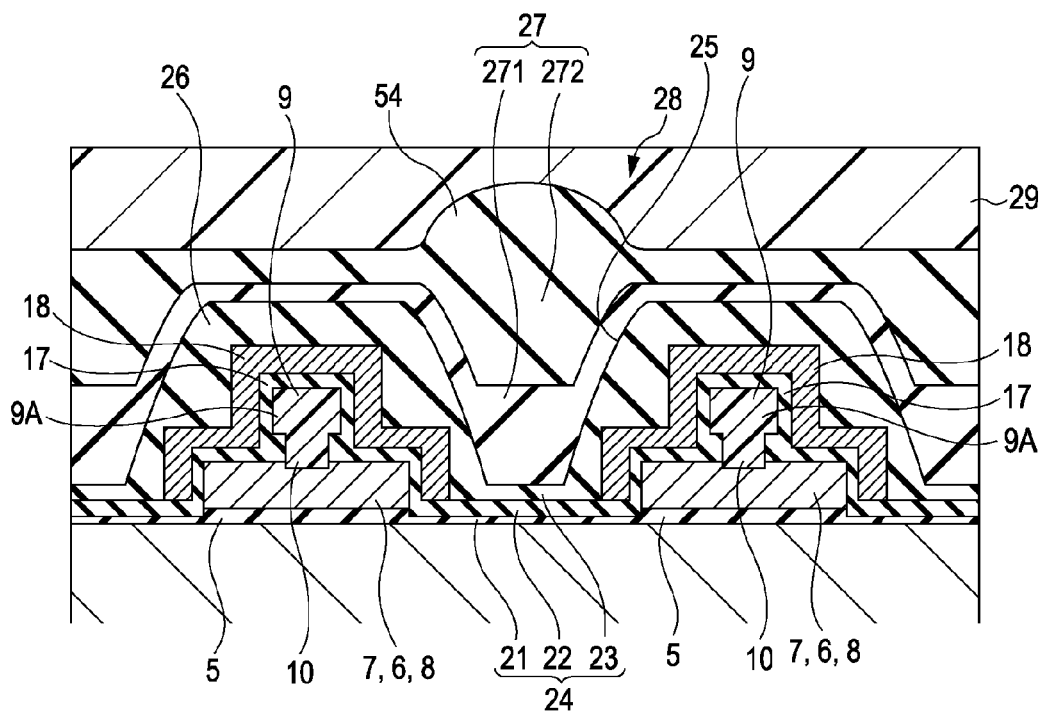

Next, as shown in FIG. 23B, an etch-back treatment is conducted all over the surface of the second film 272 including the photoresist film 58 in the shape of a lens, and an intra-layer lens 54 serving as a convex lens is formed from the second film 272, that is, a silicon nitride film. A passivation film 29 covering the resulting intra-layer lens 54 is formed. Thereafter, a planarizing film 30, an on-chip color filter 31, and an on-chip microlens 32 are formed, so that the desired solid-state imaging device 57 is obtained.

In the solid-state imaging device 57 according to the fifth embodiment, the intra-layer lens 54 is disposed on the waveguide 28 and, therefore, the efficiency of light condensation on the photodiode (PD) further increases and the sensitivity is improved. In addition, although explanation is not repeated, the same effects as those described in the first embodiment and the fourth embodiment are exerted. For example, the light condensation efficiency is improved, the sensitivity characteristic is improved, image variations are suppressed, and the smear characteristic is improved.

6. Sixth Embodiment

Configuration Example of Solid-State Imaging Device

Figure 24:
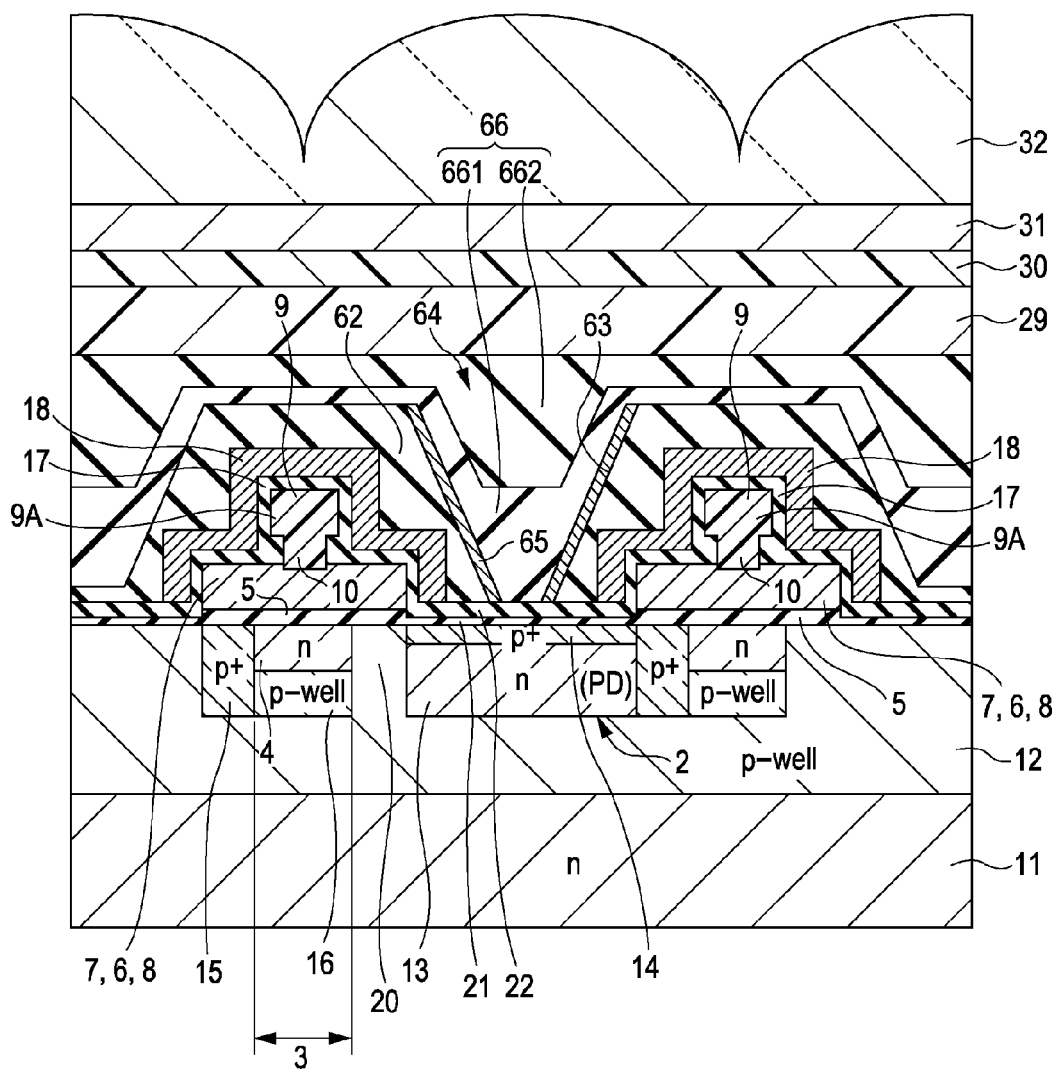
FIG. 24 is a sectional view of a key portion of a solid-state imaging device according to a sixth embodiment of the present invention.

FIG. 24 shows a sixth embodiment in which a solid-state imaging device according to an embodiment of the present invention is applied to a CCD solid-state imaging device. In a solid-state imaging device 61 according to the present embodiment, after a light-shielding film 18 is formed, an insulating film 62 is formed all over the surface, a trench portion 63 is formed in the portion, which is in accordance with a photodiode (PD) serving as a light-receiving portion 2, of the insulating film 62, and a so-called waveguide tube 64 is formed in the resulting trench portion 63. Regarding the waveguide tube 64, a reflection film 65 is formed from, for example, an Al film on the side wall of the trench portion 63, and a buried layer 66 is formed from a necessary insulating film in the trench portion 63 surrounded by the reflection film 65. The buried layer 66 may be formed from, for example, a silicon oxide film.

In the waveguide tube 64, the light incident on the buried layer 66 is condensed on the photodiode (PD) while being reflected by the reflection film 65.

Then, in the present embodiment, this buried layer 66 is formed by using the above-described HDP film formation method and conducting film formation of a first film 661 and a second film 662 while the ratio and the flow rate of the gases used are controlled, that is, the D/S ratio is controlled. Since the first film 661 is formed under the condition in which the D/S ratio is small, the first film 661 is formed as a film including no void, exhibiting good embeddability, and having a low refractive index. The second film 662 is formed on the first film 661 in the shallow trench portion 63 under the condition in which the D/S ratio is large. Therefore, the second film 662 is formed as a dense film having a high refractive index with good embeddability.

Other configuration is the same as that described in the first embodiment and, therefore, the elements corresponding to those in FIG. 2 are indicated by the same reference numerals as those set forth above and explanations thereof are not repeated.

In the solid-state imaging device 61 according to the sixth embodiment, even when the pixel size is made small and the aspect ratio of the trench portion 63 increases, a film exhibiting good embeddability is formed because the buried layer of the waveguide tube 64 is formed from the first film 661 and the second film 662. That is, the buried layer 66 is formed by using the HDP film formation method and conducting film formation of the first film 661 and the second film 662 while the ratio and the flow rate of the gases used are controlled. Consequently, no void is present in the buried layer 66, diffuse reflection resulting from the voids is suppressed, the sensitivity characteristic is improved, and an occurrence of image variation is suppressed.

7. Seventh Embodiment

Configuration Example of Solid-State Imaging Device

Figure 25:
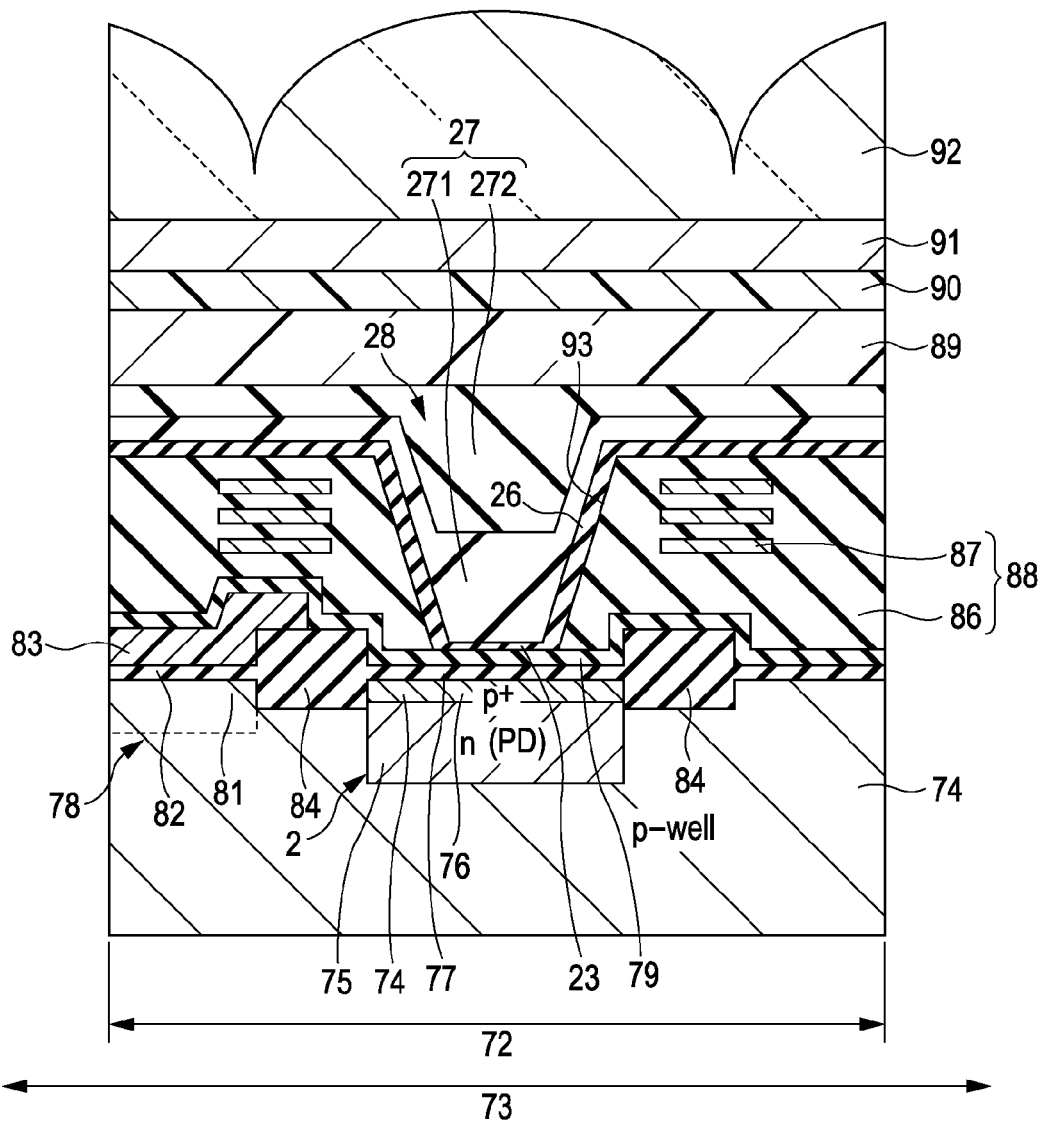
FIG. 25 is a sectional view of a key portion of a solid-state imaging device according to a seventh embodiment of the present invention.

FIG. 25 shows a seventh embodiment in which a solid-state imaging device according to an embodiment of the present invention is applied to a CMOS solid-state imaging device. A solid-state imaging device 71 according to the present embodiment is configured to include a pixel portion (imaging region) 73, in which a plurality of light-receiving portions 2 are two-dimensionally arranged, and a peripheral circuit portion (not shown in the drawing), e.g., signal processing, disposed around the pixel portion 73, on a semiconductor substrate 74, as in the case of a common CMOS solid-state imaging device. The light-receiving portion 2 is formed from a photodiode (PD) and the pixel transistor is formed from an MOS transistor. The pixel 72 includes the photodiode (PD) serving as the light-receiving portions 2 and a plurality of pixel transistors.

The photodiode (PD) constituting the pixel 72 is formed including a second electrical conduction type, for example, n-type charge accumulation region 75 and a first electrical conduction type, that is, p-type semiconductor region 76 which is disposed in the vicinity of the interface to a silicon oxide film 77 on the surface of the n-type charge accumulation region 75 and which is to suppress a dark current. The pixel transistor may usually has a four-transistor configuration including, for example, a transfer transistor, a reset transistor, an amplifying transistor, and a selection transistor or a three-transistor configuration not including a selection transistor. A pixel transistor 78 is shown as a representative and is disposed including a pair of source-drain regions 81, a gate insulating film 82, and a gate electrode 83 formed from polysilicon. The source-drain region 81 is disposed in the direction perpendicular to the drawing. The end portion of the source-drain region 81 is disposed in such a way as to straddle an element isolation region 84 having, for example, a shallow trench isolation (STI) structure.

An antireflection film 79 is formed from, for example, a silicon nitride film all over the surface including the silicon oxide film 77 on the photodiode (PD). A multilayer wiring layer 88, in which a plurality of wirings 87 are disposed with an interlayer insulating film 86 therebetween, is disposed above the pixel 62, and furthermore, a passivation film 89, a planarizing film 90, an on-chip color filter 91, and an on-chip microlens 92 are disposed thereon.

In addition, in the present embodiment, a trench portion 93 in accordance with the photodiode (PD) is disposed in the interlayer insulating film 86 of the multilayer wiring layer 88, and the above-described waveguide 28 according to an embodiment of the present invention is disposed in this trench portion 93. This waveguide 28 includes a low-refractive index clad layer 26 and a high-refractive index core layer 27. The core layer 27 is formed by using the HDP film formation method. In the film formation, a first film 271 exhibiting good embeddability and having a relatively low refractive index and a high-refractive index second film 272 thereon are formed while the D/S ratio is controlled. The configuration including a configuration, in which a silicon oxide film 23 is disposed between the core layer 27 and the antireflection film 77, or a configuration, in which a silicon oxide film is not provided, and the manufacturing method of the core layer 27 are the same as those in the above-described first embodiment and, therefore, detailed explanations will not be provided.

In the solid-state imaging device 71 according to the seventh embodiment as well, the configuration of the waveguide 28 disposed on the antireflection film 79, in particular the configuration of the core layer 27 includes the first film 271 and the second film 272 formed by using the HDP film formation method while the D/S ratio is controlled. Consequently, in a manner similar to those described in the first embodiment, the sensitivity characteristic is improved and image variations can be suppressed. Furthermore, the smear characteristic can be improved.

In the seventh embodiment, it is also possible that the core layer 27 of the waveguide 28 is configured to include the first film 273 formed by the HDP film formation method and the second film 274 formed by the parallel plate plasma CVD method, in a manner similar to those described in the fourth embodiment. Furthermore, it is possible to employ the same configuration as that in the third or the fifth embodiment in which the intra-layer lens 54 is disposed on the waveguide 28. Moreover, it is possible to employ the configuration in which the waveguide 28 is substituted by the waveguide tube 64.

In the above-described example, the core layer 27 of the waveguide 28 and the buried layer 58 of the waveguide tube 56 are formed by using the HDP film formation method. In the present invention, a film formation method other than the HDP film formation method may be used, and film formation and embedding may be conducted in a plurality of stages, so as to form the core layer 27 or the buried layer 66 having a refractive index distribution in the wave-guiding direction.

The solid-state imaging device in the above-described example has a configuration in which the electron serves as the signal charge. However, the hole may serve as the signal charge. In this case, the n-type is specified to be the first electrical conduction type, the p-type is specified to be the second electrical conduction type, and the electrical conduction type of each semiconductor region is specified to be the electrical conduction type reverse to that in the above description.

8. Eighth Embodiment

Configuration Example of Electronic Apparatus

The solid-state imaging device according to an embodiment of the present invention can be applied to electronic apparatuses, e.g., cameras provided with solid-state imaging devices, portable apparatuses with cameras, and other apparatuses provided with solid-state imaging devices.

Figure 26:
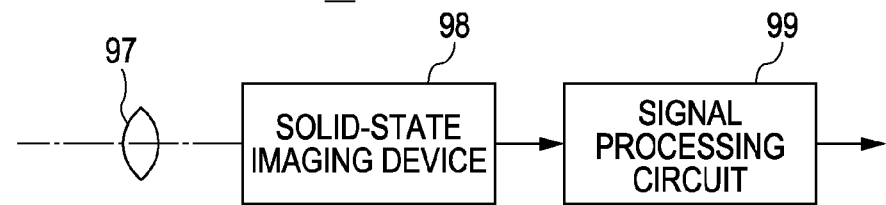
FIG. 26 is a schematic configuration diagram of an electronic apparatus according to an eighth embodiment of the present invention.

FIG. 26 shows an embodiment, in which the solid-state imaging device is applied to a camera, as an example of the electronic apparatus according to the present invention. A camera 96 according to the present invention includes an optical system (optical lens) 97, a solid-state imaging device 98, and a signal processing circuit 99. The solid-state imaging device according to any one of the above-described embodiments is applied to the solid-state imaging device 98. The optical system 97 forms an image of image light (incident light) from a subject on an imaging surface of the solid-state imaging device. Consequently, a signal charge is accumulated for a certain period in a photoelectric conversion element of the solid-state imaging device 98. The signal processing circuit 99 applies various types of signal processing to output signals of the solid-state imaging device 98 and output them. The camera 96 according to the present embodiment includes the form of a camera module in which the optical system 97, the solid-state imaging device 98, and the signal processing circuit 99 are combined into a module.

According to an embodiment of the present invention, the camera shown in FIG. 26, a portable apparatus with camera which includes a camera module and which is typified by, for example, a cellular phone, or the like can be formed.

Furthermore, the configuration shown in FIG. 26 may be a module having an imaging function, that is, a so-called imaging function module in which the optical system 97, the solid-state imaging device 98, and the signal processing circuit 99 are combined into a module. According to an embodiment of the present invention, an electronic apparatus provided with the above-described imaging function module may be formed.

According to the electronic apparatus of the present embodiment, the sensitivity characteristic of the solid-state imaging device is improved, and an occurrence of image variation can be suppressed. Consequently, a high-image quality, high quality electronic apparatus can be provided.

The present application contains subject matter related to that disclosed in Japanese Priority Patent Application JP 2008-251668 filed in the Japan Patent Office on Sep. 29, 2008 and JP 2009-042962 filed in the Japan Patent Office on Feb. 25, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a light-receiving portion serving as a pixel; and
a waveguide disposed at a location in accordance with the light-receiving portion, the waveguide including a core layer overlying and embedded in a clad layer, the embedded core layer having a refractive index distribution in the wave-guiding direction, the clad layer having a trench portion in which the core layer is embedded, the trench having inclined sidewalls,
wherein,
the core layer includes a first film and a second film, the first film disposed over the clad layer and having a low refractive index, the second film disposed over the first film, the second film having a refractive index higher than that of the first film.

2. The device as recited in claim 1, wherein the first film comprises a plurality of films having different refractive indices.

3. The device as recited in claim 1, wherein the first film comprises a film in which the refractive index is changed continuously.

4. The device as recited in claim 1, further comprising an antireflection film in contact with the clad layer that is disposed on the surface of the light-receiving portion.

5. The device as recited in claim 4, further comprising an insulating film disposed between the first film of the core layer and the antireflection film, the insulating film having a refractive index higher than the refractive index of the antireflection film and lower than the refractive index of the core layer.

6. A solid-state imaging device, comprising:
a light-receiving portion serving as a pixel; and
a waveguide tube disposed at a location in accordance with the light-receiving portion, the waveguide tube including a buried layer embedded in a trench portion, the buried layer having a refractive index distribution in the wave-guiding direction, the trench portion having inclined sidewalls surrounded by a reflection film, the buried layer including a first film and a second film, the first film formed in the trench portion and having a low-refractive index, the second film having a higher refractive index and formed over the first film in an upper area of the trench portion.

7. An electronic system, comprising:
a solid-state imaging device;
an optical system to guide incident light to the solid-state imaging device; and a signal processing circuit to process an output signal from the solid-state imaging device, wherein, the solid-state imaging device includes (a) a light-receiving portion serving as a pixel and (b) a waveguide disposed at a location in accordance with the light-receiving portion, the waveguide including a core layer overlying and embedded clad layer, the embedded core layer having a refractive index distribution in the wave-guiding direction, the clad layer having a trench portion in which the core layer is embedded, the trench having inclined sidewalls, and the core layer includes a first film and a second film, the first film disposed over the clad layer and having a low refractive index, the second film disposed over the first film, the second film having a refractive index higher than that of the first film.

8. The device as recited in claim 1, wherein the clad layer comprises a material having a low-refractive index, the low-refractive index of the clad layer being lower than the refractive indexes of the first film and the second film in the core layer.

9. The device as recited in claim 1, wherein the clad layer comprises a silicon oxide film having a refractive index of 1.45.

10. The device as recited in claim 1, wherein the first film in the core layer comprises a silicon oxynitride (SiON) film and the second film in the core layer comprises a silicon nitride (SiN) film.

11. The device as recited in claim 1, wherein the first film in the core layer comprises a silicon oxynitride (SiON) film having a refractive index of 1.7 and the second film in the core layer comprises a silicon nitride (SiN) film having a refractive index of 1.8.

12. The device as recited in claim 5, wherein the antireflection film comprises silicon nitride (SiN), and the insulating film comprises silicon oxide ($SiO_2$).

13. The device as recited in claim 5, wherein the insulating film having a refractive index of about 1.4 to 1.6.

14. The device as recited in claim 1, wherein the triangular-shaped trench has a base length that is less than a top surface length of the light-receiving portion.

15. The device as recited in claim 1, wherein the light-receiving portion comprises a photodiode (PD).

16. the device as recited in claim 6, wherein the reflection film comprises aluminum (Al).

* * * * *